(12) United States Patent
Tei et al.

(10) Patent No.: US 6,929,830 B2
(45) Date of Patent: Aug. 16, 2005

(54) PLASMA TREATMENT METHOD AND METHOD OF MANUFACTURING OPTICAL PARTS USING THE SAME

(75) Inventors: Goushu Tei, Utsunomiya (JP); Nobuyoshi Tanaka, Tokyo (JP); Tadahiro Ohmi, Sendai (JP); Masaki Hirayama, Sendai (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/449,106

(22) Filed: Jun. 2, 2003

(65) Prior Publication Data

US 2003/0203125 A1 Oct. 30, 2003

Related U.S. Application Data

(62) Division of application No. 09/209,496, filed on Dec. 11, 1998, now abandoned.

(30) Foreign Application Priority Data

Dec. 12, 1997 (JP) .............................. 9-343085
Dec. 12, 1997 (JP) .............................. 9-343086
Dec. 12, 1997 (JP) .............................. 9-343087

(51) Int. Cl.[7] .......................... B05D 5/06; C03C 17/245; H05H 1/46
(52) U.S. Cl. .................. 427/575; 427/579; 427/162; 427/167; 427/163.4; 118/723 MW
(58) Field of Search ................ 427/569, 574, 427/575, 579, 488, 489, 162, 167, 163.1, 163.4; 118/723 MW, 723 ME, 723 MA, 723 MR, 723 AN, 723 I, 723 IR

(56) References Cited

U.S. PATENT DOCUMENTS

| 4,430,138 | A | | 2/1984 | Suzuki et al. ............... 156/345 |
|---|---|---|---|---|
| 4,438,368 | A | | 3/1984 | Abe et al. ..................... 315/39 |
| 4,947,085 | A | | 8/1990 | Nakanishi et al. ....... 315/111.41 |
| 4,971,651 | A | | 11/1990 | Watanabe et al. ........... 156/643 |
| 4,985,113 | A | | 1/1991 | Fujimoto et al. ........... 156/643 |
| 5,017,404 | A | * | 5/1991 | Paquet et al. |
| 5,034,086 | A | | 7/1991 | Sato ........................ 156/345 |
| 5,079,033 | A | | 1/1992 | Schulz et al. ................ 427/44 |
| 5,154,943 | A | * | 10/1992 | Etzkorn et al. ............. 427/569 |
| 5,234,526 | A | | 8/1993 | Chen et al. .................. 156/345 |
| 5,346,578 | A | | 9/1994 | Benzing et al. ............. 156/345 |
| 5,439,524 | A | | 8/1995 | Cain et al. ............... 118/723 E |
| 5,522,934 | A | | 6/1996 | Suzuki et al. ......... 118/723 AN |
| 5,554,255 | A | | 9/1996 | Karner et al. ............ 156/643.1 |
| 5,556,521 | A | | 9/1996 | Ghanbari ............... 204/192.32 |
| 5,580,385 | A | | 12/1996 | Paranjpe et al. .......... 118/723 I |
| 5,628,869 | A | | 5/1997 | Mallon ....................... 438/694 |
| 5,643,365 | A | * | 7/1997 | Blinov et al. ....... 118/723 MW |
| 5,698,036 | A | | 12/1997 | Ishii et al. .......... 118/723 MW |
| 5,716,451 | A | | 2/1998 | Hama et al. ................. 118/723 |
| 5,824,158 | A | | 10/1998 | Takeuchi et al. ....... 118/723 IR |
| 5,874,706 | A | | 2/1999 | Ishii et al. ............. 219/121.43 |
| 5,923,693 | A | | 7/1999 | Ohmi et al. ................... 372/57 |
| 5,976,308 | A | | 11/1999 | Fairbairn et al. ........... 156/345 |
| 6,001,429 | A | * | 12/1999 | Martin ....................... 427/579 |
| 6,158,383 | A | | 12/2000 | Watanabe et al. ..... 118/723 AN |
| 6,215,806 | B1 | | 4/2001 | Ohmi et al. ................... 372/57 |
| 6,854,309 | B2 | * | 2/2005 | Shimada ........................ 72/46 |
| 2005/0045589 | A1 | * | 3/2005 | Rastogi et al. ................ 216/67 |

FOREIGN PATENT DOCUMENTS

| JP | 1-184923 | 7/1989 |
|---|---|---|
| JP | 2-232367 | 9/1990 |
| JP | 4-48805 | 2/1992 |

(Continued)

Primary Examiner—Marianne Padgett
(74) Attorney, Agent, or Firm—Fitzpatrick, Cella, Harper & Scinto

(57) ABSTRACT

A method for treating a non-planar surface of an object by employing a plasma treatment apparatus in which a microwave dielectric has a non-planar surface corresponding to the surface of the object. A method for forming an optical part is also provided.

12 Claims, 20 Drawing Sheets

FOREIGN PATENT DOCUMENTS

| | | |
|---|---|---|
| JP | 5-22025 | 1/1993 |
| JP | 6-216047 | 8/1994 |
| JP | 8-111297 | 4/1996 |
| WO | 98/33362 | 7/1998 |

* cited by examiner

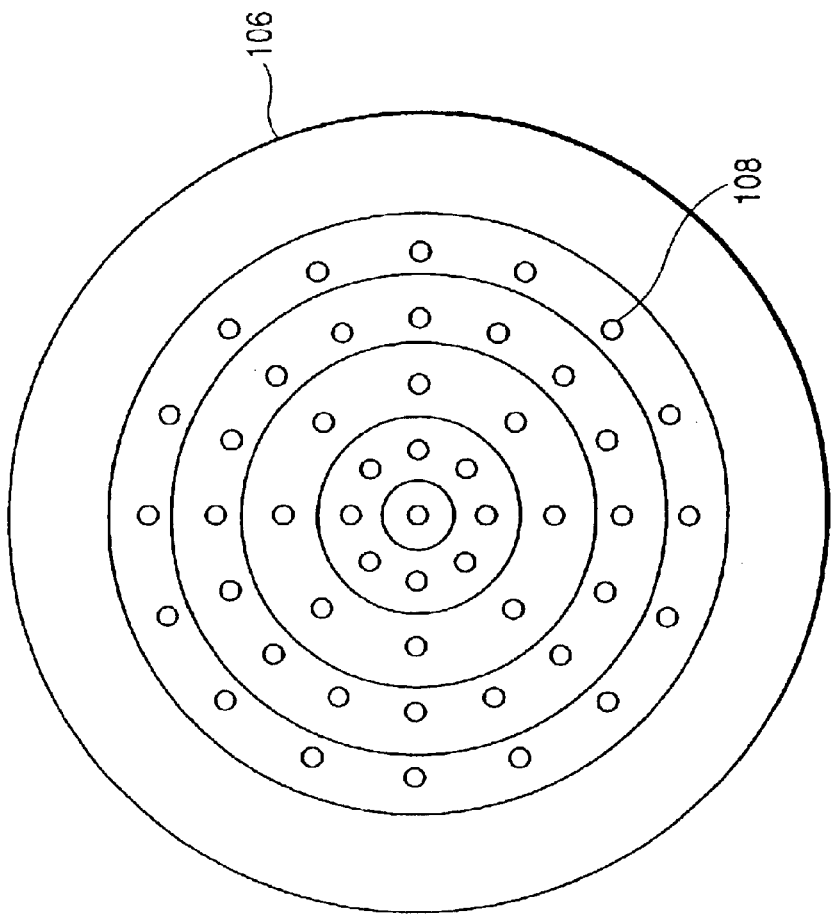
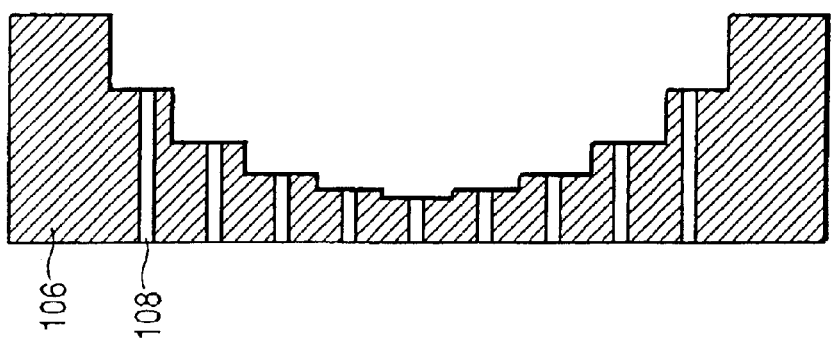

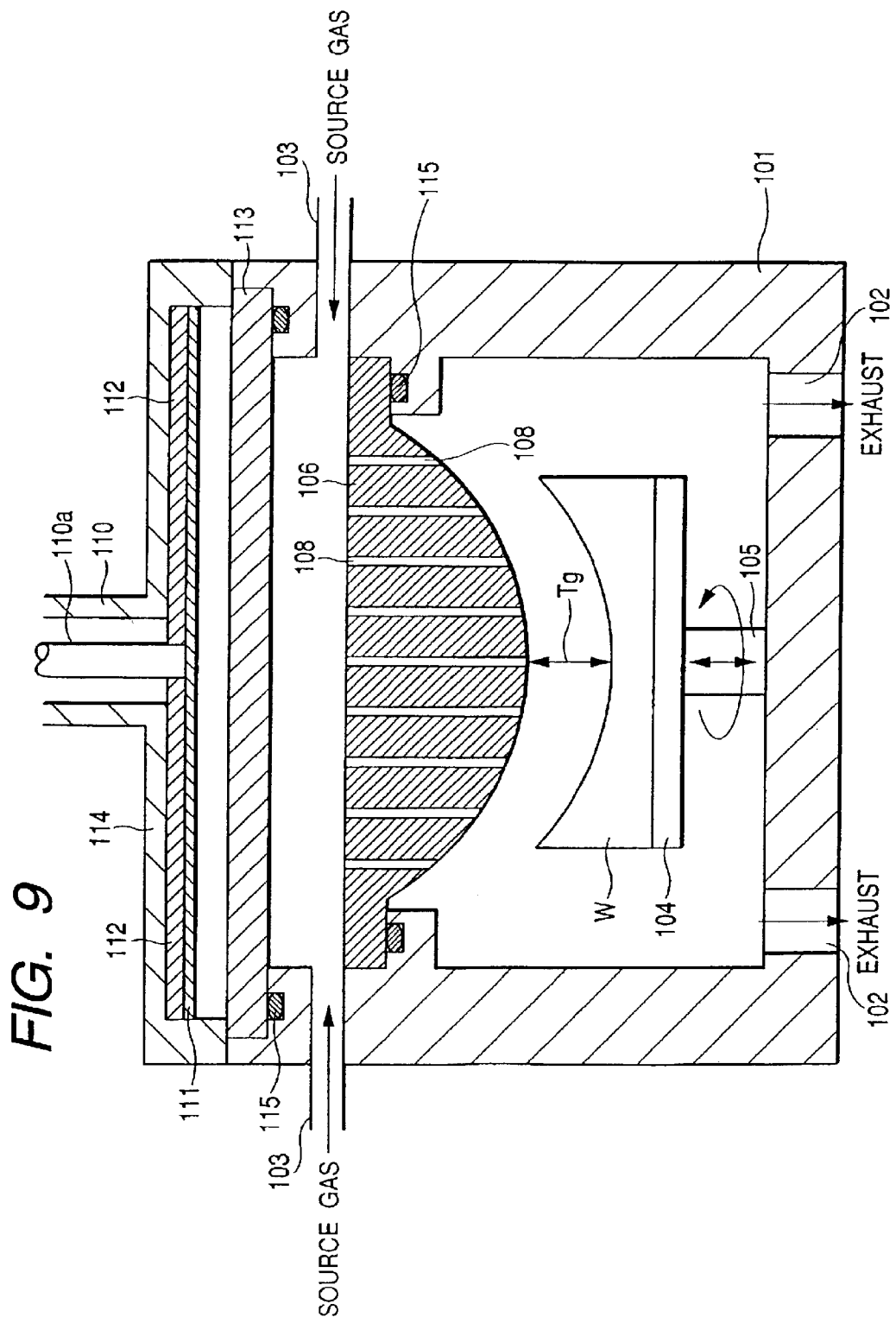

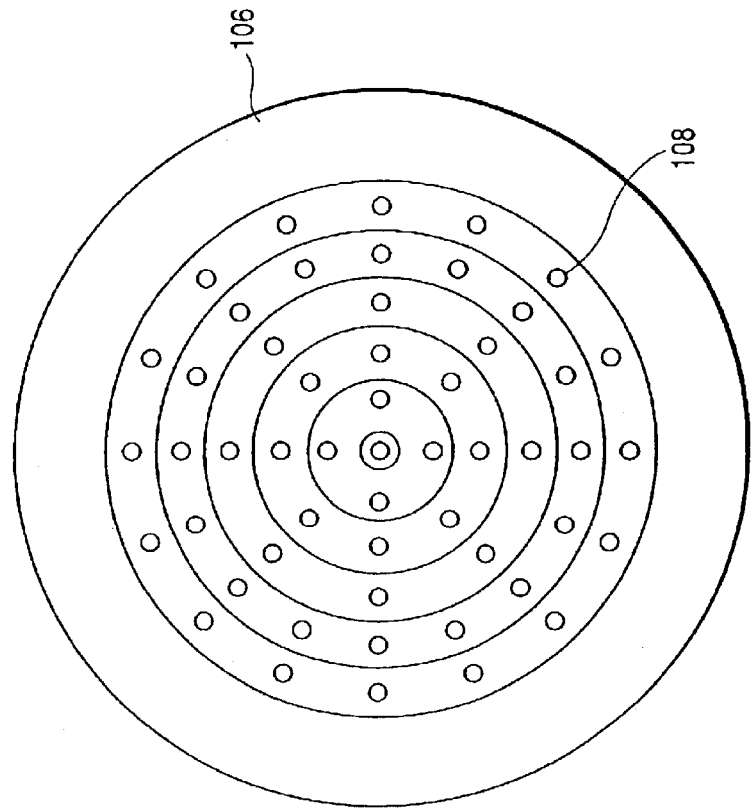
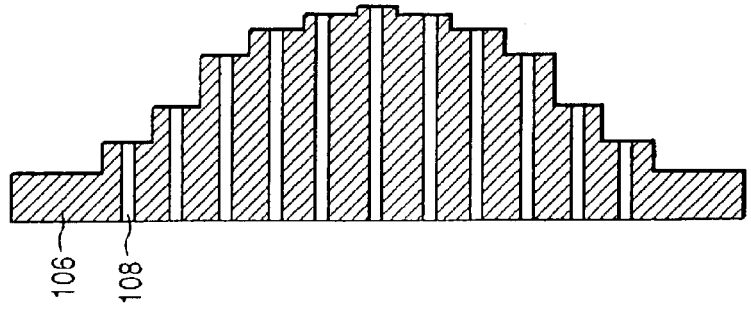
FIG. 12B
FIG. 12A

PLASMA TREATMENT METHOD AND METHOD OF MANUFACTURING OPTICAL PARTS USING THE SAME

This application is a division of application Ser. No. 09/209,496, filed on Dec. 11, 1998 now abandoned, which is incorporated herein by reference.

BACKGROUND OF THE INVENTION

1. Field of the Invention

This invention relates to a plasma treatment apparatus adapted to treating the surface of an optical part having a non-planar surface to be treated such as a convex lens, a concave lens or a concave mirror. More broadly, it relates to a technological field of manufacturing optical parts, using such an apparatus.

2. Related Background Art

There is a demand for improved surface treatment techniques to be used for cleaning and/or forming a film coat on objects having a non-planar surface. An anti-reflection film formed on a convex lens may be a typical example of film coat of the type under consideration.

Japanese Patent Application Laid-Open No. 2-232367 describes a typical known film forming method employing PVD, which may be sputtering. However, because PVD is not highly effective for forming a film coat on an object having an undulated or otherwise non-planar surface, the inventors of the present invention have been trying to form a film coat on objects of treatment by CVD.

Since the technique of thermal CVD has a disadvantage of producing thermal deformations, it is not adapted to forming a film coat of the type under consideration. On the other hand, the technique of optical CVD is not satisfactory in terms of throughput.

Meanwhile, even the technique of plasma excitation CVD (PECVD) using an RF power source with a frequency of 13.56 MHz is not satisfactory for producing an anti-reflection film having a higher transmission coefficient (lower absorption coefficient) than those currently obtainable by PVD and having improved light resistance and environment resistance. Therefore, a PECVD technique that can produce a higher plasma density will have to be used.

A technique of electrodeless PECVD using a microwave such as electron-cyclotron-resonance CVD (ECR-PECVD) is known to produce a high density plasma exceeding the density level of $10^{10}$ cm$^{-3}$.

FIG. 24 of the accompanying drawings is a schematic cross sectional view of a plasma treatment apparatus disclosed in Japanese Patent Application Laid-Open No. 6-216047.

Referring to FIG. 24, this apparatus comprises a plasma generator chamber 2 and a treatment chamber 4, of which the plasma generator chamber 2 contains therein microwave power introducing means 5, 6, 8 and a magnetic field applying means 10 and is connected to a plasma source gas introduction system 20 while the treatment chamber 4 is connected to a chemically reactive material gas introduction system 22, sample table 14 of the apparatus being connected to an RF power introducing means 18. Additionally, a control unit 27 is provided to modulate the power output of the microwave power generator 8 and that of the RF power generator 18. With this arrangement, the RF power and the microwave power are modulated synchronously and the film forming conditions are alternately modified in favor of film forming and in favor of sputtering/etching to produce a CVD film.

While an anti-reflection film formed on a convex lens by means of an apparatus as shown in FIG. 24 is dense and fine in average, it is relatively poor in terms of intra-surface uniformity. More specifically, reaction by-products can frequently remain on and near the treated surface to give rise to areas showing different compositional ratios. Such by-products can adhere to the surface, and, if they are removed during or after the film-forming process, pin holes can be produced in the film.

SUMMARY OF THE INVENTION

It is therefore an object of the present invention to provide a plasma treatment apparatus that can produce a film coat substantially free from pin holes and other local defects and showing an excellent intra-surface uniformity and an outstanding coating effect.

According to an aspect of the invention, there is provided a plasma treatment apparatus for treating a surface of an object of treatment, comprising a pressure reducible container, a gas supply means for supplying gas into the container for plasma excitation, an evacuation means for evacuating the inside of the container, and a microwave supply means for supplying a microwave into the container, the microwave supply means having a plurality of microwave emitting members and its surface located opposite to the object of treatment being directed in a predetermined direction relative to the surface to be treated of the object of treatment.

According to another aspect of the invention, there is provided a plasma treatment apparatus for treating a surface of an object of treatment, comprising a pressure reducible container, a gas supply means for supplying gas into the container for plasma excitation, an evacuation means for evacuating the inside of the container, and a microwave supply means for supplying a microwave into the container, the surface of the microwave supply means located opposite to the object of treatment being a non-planar surface having a contour corresponding to that of the surface to be treated of the object of treatment.

Preferably, the gas blow-in port of the gas supply means is arranged at an end of an antenna made of a conductor member and having a slot.

According to still another aspect of the invention, there is provided a plasma treatment apparatus for treating a surface of an object of treatment, comprising a container, a gas supply means for supplying gas into the container for plasma excitation, an evacuation means for evacuating the inside of the container, and a microwave supply means for supplying a microwave into the container, the surface of the microwave supply means located opposite to the object of treatment being a non-planar surface having a contour corresponding to that of the surface to be treated of the object of treatment and the non-planar surface being formed of a microwave-transmitting dielectric.

Preferably, gas is supplied through a plurality of openings arranged on the non-planar surface.

Preferably, the microwave supply means has an antenna made of a flat plate of a conductor and having a number of slots.

Still preferably the non-planar surface is a convex or concave spherical surface formed on the microwave-transmitting dielectric.

According to a still another aspect of the invention, there is provided a method of manufacturing an optical part comprising a step of treating a concave or convex surface of the optical part by means of a plasma treatment apparatus as defined above.

According to a further aspect of the invention, there is provided a plasma treatment apparatus for treating a surface of an object of treatment by means of plasma, comprising a container, a gas supply means for supplying gas into the container for plasma excitation, and an evacuation means for evacuating the inside of the container, a part of the walls of the container being made of a dielectric plate of a material adapted to transmit microwaves, the dielectric plate having a convex or concave spherical surface with a predetermined radius of curvature (ra), an antenna for emitting a microwave and an electrode adapted to hold the object of treatment being arranged respectively at the outside and at the inside of the container to sandwich the dielectric plate.

Preferably, the dielectric plate has a shower-head-like profile provided with a plurality of gas supply holes for evenly supplying gas to the surface of the object of treatment.

Preferably, in a plasma treatment apparatus as defined above, the radius of curvature (ra) and the radius of aperture (da) of the dielectric plate are variable.

Still preferably, the distance (Tg) between the inner surface of the dielectric plate and the surface to be treated of the object of treatment is between 10 mm and 50 mm.

Still preferably, the relative density difference of the plasma in the surface to be treated is suppressed to less than about 20%.

Still preferably, the variations in the plasma density due to the variations in the thickness of the dielectric plate can be corrected by making at least the size, the profile or the number of the slots formed in the antenna to show a distribution pattern.

Preferably, the object of treatment is held by a support member provided with a rotary mechanism.

Preferably, the non-planar surface is a stepped surface obtained by forming coaxial steps.

Preferably, the gas supply means has a stepped shower-head-like profile.

Preferably, the main body of the antenna has a spherical or stepped profile.

Then, the antenna having a spherical or stepped profile is arranged within the container.

Preferably, a non-planar surface is formed by using a plurality of such antennas.

According to a still another aspect of the invention, there is also provided a surface treatment method for treating the surface of an object of treatment by means of an apparatus as defined above.

Preferably, the surface treatment consists in forming a thin film.

According to still another aspect of the invention, there is provided a method of manufacturing an optical part by using a surface treatment method as defined above and forming an anti-reflection or reflection-boosting thin film on an object of treatment made of silicon oxide or calcium fluoride.

According to the invention, a dense and fine film can be obtained because high density plasma excited by one or more than one microwaves can be confined within a narrow electric discharge space.

Additionally, according to the invention, a large surface can be treated uniformly by plasma because the surface to be treated is located in a region showing a uniform plasma density.

Still additionally, according to the invention, pin holes will hardly be produced on the treated surface because the volume of the electric discharge space is reduced, the inside of the electric discharge chamber can be evacuated easily by means of a vacuum pump with a relatively small evacuation capacity and the reaction by-products, if any, can be quickly removed out of the electric discharge chamber. A uniform gas supply can be realized in a narrow space if a large number of gas supply holes are formed in a dielectric so that a film showing a constant compositional ratio may be formed on the surface.

BRIEF DESCRIPTION OF THE DRAWINGS

FIGS. 8A and 8B are a schematic cross sectional view and a schematic plan view of the dielectric plate shown in FIG. 7.

FIG. 9 is a schematic cross sectional view of another embodiment of plasma treatment apparatus obtained by modifying the embodiment of FIG. 1 and suitably adapted to surface treatment of a concave lens.

FIGS. 12A and 12B are a schematic cross sectional view and a schematic plan view of the dielectric plate of the apparatus of FIG. 11.

DESCRIPTION OF THE PREFERRED EMBODIMENTS

Figure 1:
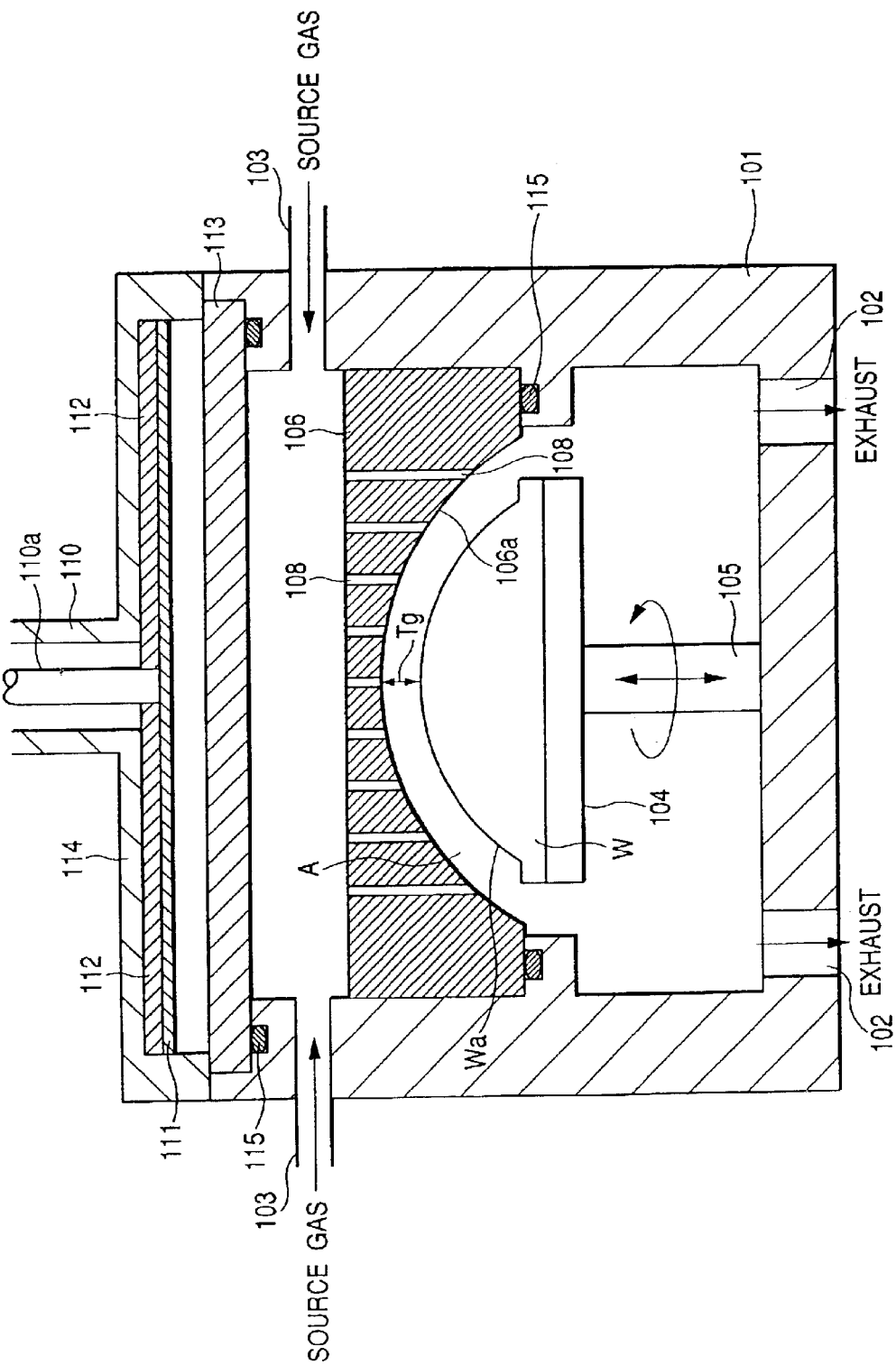
FIG. 1 is a schematic cross sectional view of an embodiment of plasma treatment apparatus according to the invention.

FIG. 1 is a schematic cross sectional view of an embodiment of plasma treatment apparatus according to the invention.

Referring to FIG. 1, 101 denotes a pressure reducible container, the internal pressure of which can be reduced to a level between about $1.33 \times 10^{-6}$ Pa and about 133 Pa by means of an evacuation means (not shown) connected to the exhaust port 102 of the container 101.

The container 101 is provided with a number of gas supply ports 103, through which gas can be fed into the container and turned into plasma by means of high frequency energy in the frequency band of UHF, SHF or EHF such as that of a microwave.

The container 101 contains therein a holder 104 for carrying and holding an object of treatment W. The holder 104 is vertically movable so that it may achieve a selected height and is also revolvable. A bias potential may be applied to the holder 104. A holder drive mechanism 105 is arranged to drive the holder to move vertically and/or revolve.

In FIG. 1, 106 denotes a non-planar dielectric plate provided with a number of gas supply ports 108 and made of a dielectric substance. It operates as a shower head for supplying gas.

The dielectric plate is made of a dielectric substance that can transmit microwaves. Materials that can be used for the dielectric plate include aluminum oxide ($Al_2O_3$), silicon oxide ($SiO_2$), aluminum nitride (AlN), calcium fluoride ($CaF_2$) and magnesium fluoride (MgF) that may or may not show a stoichiometric ratio.

The gas fed into the container 101 from a gas supply system (not shown) by way of the gas supply ports 103 is directed into plasma processing space A by way of gas supply paths 108 arranged in the dielectric plate 106.

The dielectric plate 106 has a concave and spherical lower surface because it is adapted to treat the surface of a convex lens having a spherical profile. The object W is made of silicon oxide or calcium fluoride.

In FIG. 1, 115 denotes an O-ring for securing a vacuum condition inside the treatment space.

Figure 2:
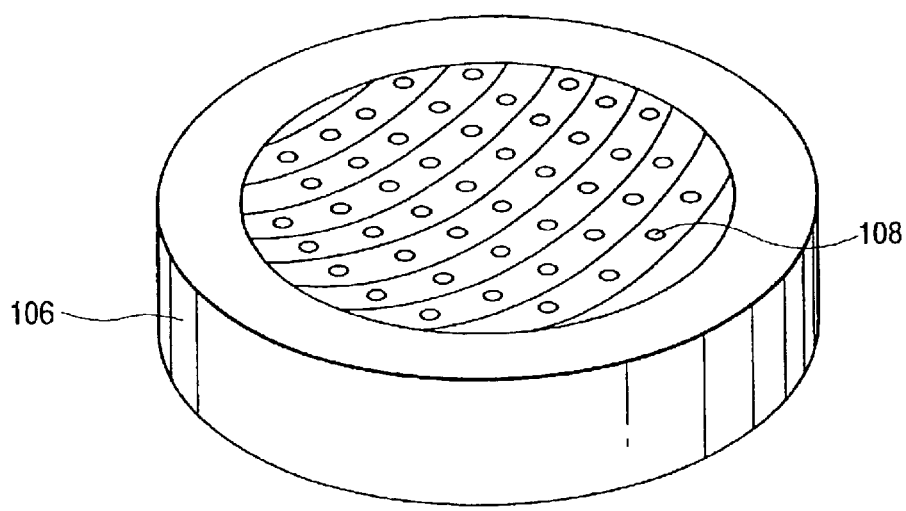
FIG. 2 is a schematic perspective view of the non-planar dielectric plate of the embodiment of FIG. 1.

FIG. 2 is a schematic perspective view of the non-planar dielectric plate 106 of the embodiment of FIG. 1. Note that the lower surface located vis-a-vis the object of treatment in FIG. 1 is made to face upward in FIG. 2. Also note that gap separating the gas supply paths 108 of the dielectric plate 106 and the object of treatment W shows a constant value for all the paths, which is found within a permissible range.

A microwave is introduced in a manner as described below.

The microwave supply means comprises a coaxial tube 110, a conductor flat plate antenna 111 having a number of slots, a dielectric member 113 operating as microwave supply window and a dielectric plate 106. The inner conductor 110a of the coaxial tube 110 is connected to the center of the conductor flat plate antenna 111. Reference numeral 114 in FIG. 1 denotes an antenna adapter.

The microwave generated by a microwave oscillator (not shown) is transmitted or propagated to the conductor flat plate antenna 111 that operates as microwave supply plane by way of the coaxial tube 110. The microwave that has been transmitted is then emitted through the slots arranged in the antenna 111.

Figure 3:
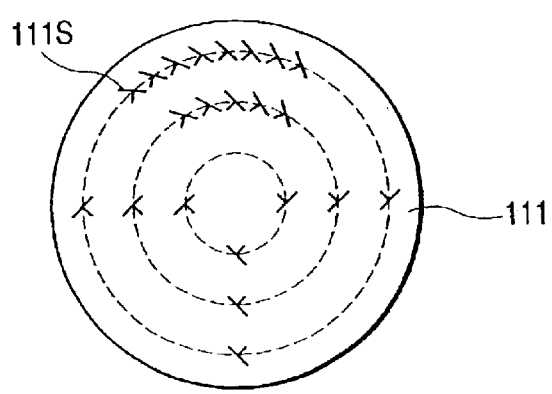
FIG. 3 is a schematic plan view of the conductor flat plate antenna of the embodiment of FIG. 1.

FIG. 3 is a schematic plan view of the conductor flat plate antenna 111 of the embodiment of FIG. 1.

A number of slots 111S are arranged coaxially or helically or vortically in the conductor flat plate antenna as shown in FIG. 3. Each of the slots comprises a pair of notches directed to intersect each other, the lengths and the intervals of the notches being appropriately selected as a function of wavelength of the microwave and the plasma intensity required for the surface treatment.

Such an antenna is referred to as radial line slot antenna and described in detail in Japanese Patent Application Laid-Open No. 1-184923 and U.S. Pat. No. 5,034,086 as well as in Japanese Patent Applications Laid-Open Nos. 8-111297 and 4-48805.

Now, an operation of forming a thin film on a lens having a spherical surface by means of the above embodiment of plasma treatment apparatus according to the invention will be described below.

Firstly, a convex lens is placed on the holder 104 in the apparatus and securely held in position with the surface to be treated of the lens facing upward.

Then, the holder 104 is raised by means of the drive mechanism 105 until the surface 106a of the microwave supply means facing the object of treatment and the opposite surface Wa to be treated of the object are separated by a distance of 10 mm and 50 mm.

Then, after reducing the internal pressure of the container 101 to about $1.3 \times 10^{-5}$ Pa by means of the evacuation pump connected to the exhaust port 102, processing gas is fed into the plasma processing space A by way of the gas supply paths 108 as gas is supplied from the supply-system connected to the gas supply port 103. The internal pressure of the container is held to an appropriately selected level between 13.3 Pa and $1.33 \times 10^3$ Pa by controlling both the gas supply rate and the gas exhaust rate. Then, a microwave is supplied to the conductor flat plate antenna 111 by way of the coaxial tube 110 as the microwave is supplied from the microwave oscillator connected to the coaxial tube 110. The microwave emitted from the conductor flat plate antenna 111 is led into the plasma processing space A through the dielectric member 113 and the dielectric plate 106.

Thus, a glow discharge occurs to produce gas plasma in the plasma processing space A. The produced plasma will show a high density of between $10^{11}$ and $10^{13}$ $cm^{-3}$ so that a dense and high quality film will be formed on the lens.

With this embodiment, since the width, or the gap Tg, of the plasma processing space is less than 10 mm (more specifically less than 50 mm and much less than 10 mm), any reaction by-products produced in the space A can be quickly removed with exhaust gas so that the formed film will be practically free from pin holes and hence of high quality. The fact that the gap Tg is less than 50 mm allows the use of a vacuum pump having a relatively small evacuation capacity for quickly removing the reaction by-products.

Figure 4:
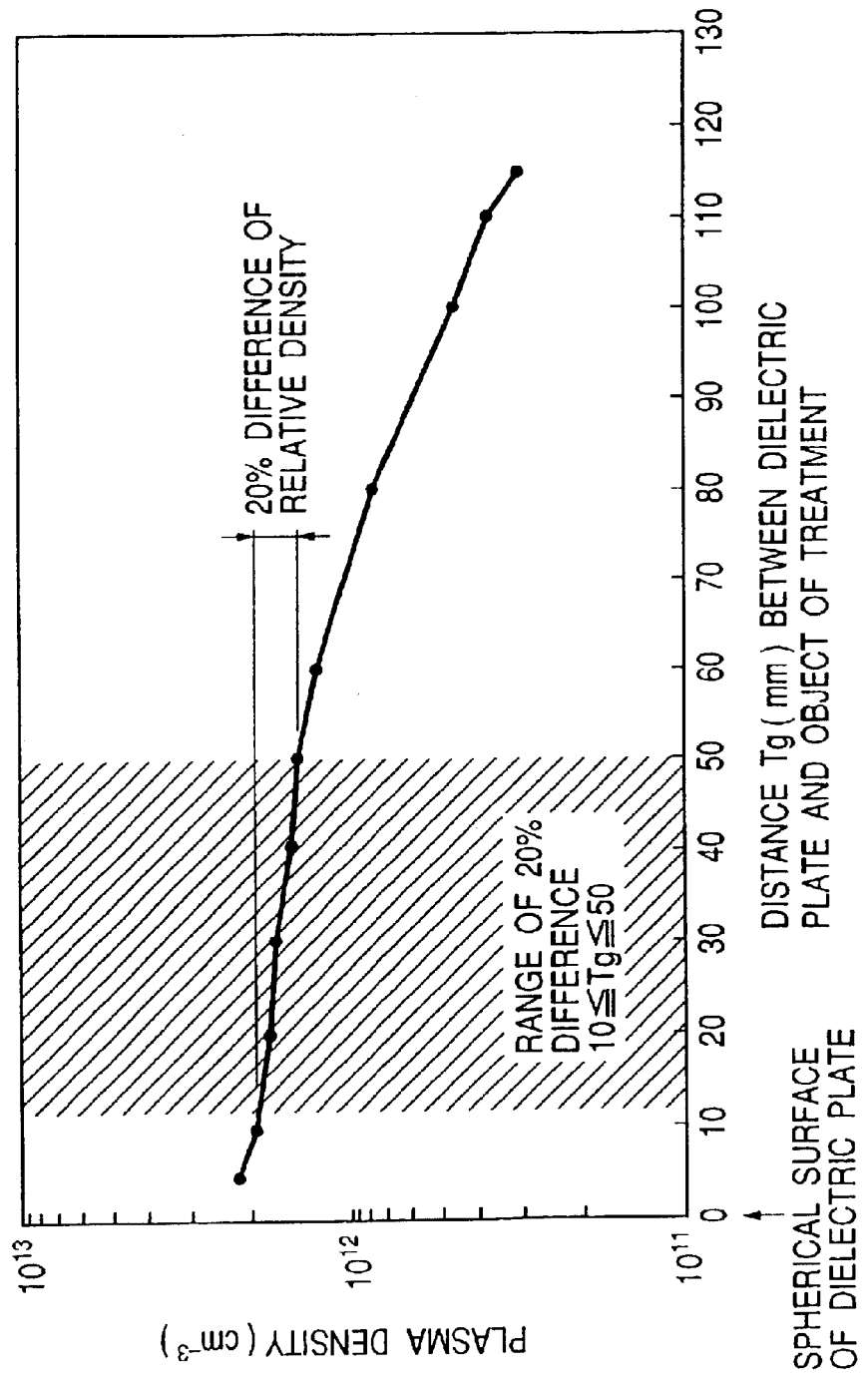
FIG. 4 is a graph showing the relationship between the gap separating the dielectric plate and the object of treatment and the plasma density in the embodiment of FIG. 1.

FIG. 4 is a graph showing the relationship between the gap Tg separating the dielectric plate and the object of treatment and the plasma density in the embodiment of FIG. 1. It will be seen that, when Tg is smaller than 10 mm, the plasma density changes significantly depending on Tg, and when Tg exceeds 50 mm, the plasma density falls abruptly. However, the relative density difference of the plasma is found below 20% so that consequently a uniform film will be formed when the gap is found within the range of 10 mm<Tg≦50 mm sandwiched between a pair of inflection points in FIG. 4.

Figure 5:
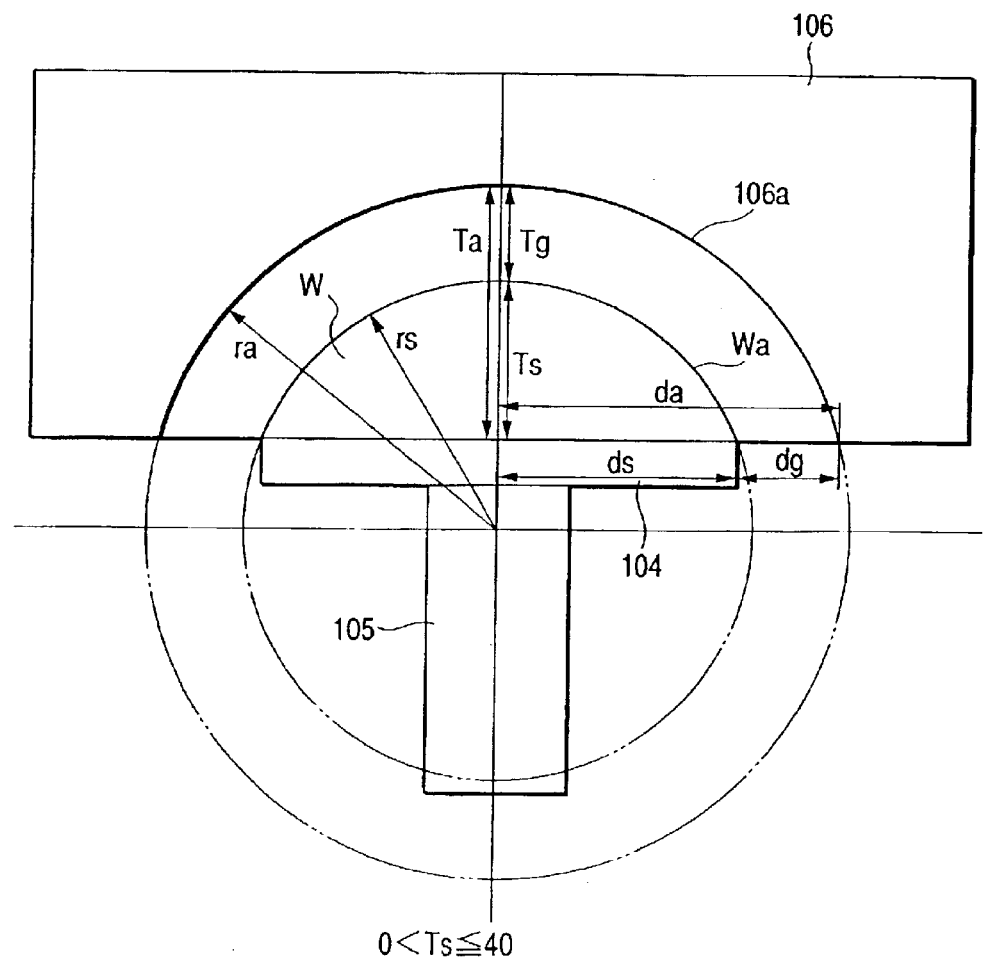
FIG. 5 is a schematic side view of the non-planar profile of the dielectric plate used in the embodiment of FIG. 1 when treating the surface of a convex lens whose largest thickness is less than 40 mm.

FIG. 5 is a schematic side view of the non-planar profile of the dielectric plate 106 used in the embodiment of FIG. 1 when treating the surface of a convex lens whose largest thickness Ts is less than 40 mm. In FIG. 5, Ts denotes the largest thickness of the convex lens to be treated and rs and ds respectively denote the radius of curvature and the radius of aperture of the convex lens.

On the other hand, ra denotes the radius of curvature of the spherical microwave emitting surface 106a of the dielectric plate 106 and Ta and da respectively denote the shortest and longest distances between the center of the convex lens and the spherical microwave emitting surface 106a.

With this embodiment, it is sufficient for the distance between the surface Wa of the convex lens and the microwave emitting surface 106a to be found between 10 mm and 50 mm and hence the microwave emitting surface is not necessarily required to be spherical so that it may alternatively be flat. However, the use of a surface having a contour similar to that of the surface of the convex lens is selected in order to remove gas efficiently from the gap and realize an enhanced degree of uniformity for the surface treatment.

Figure 6:
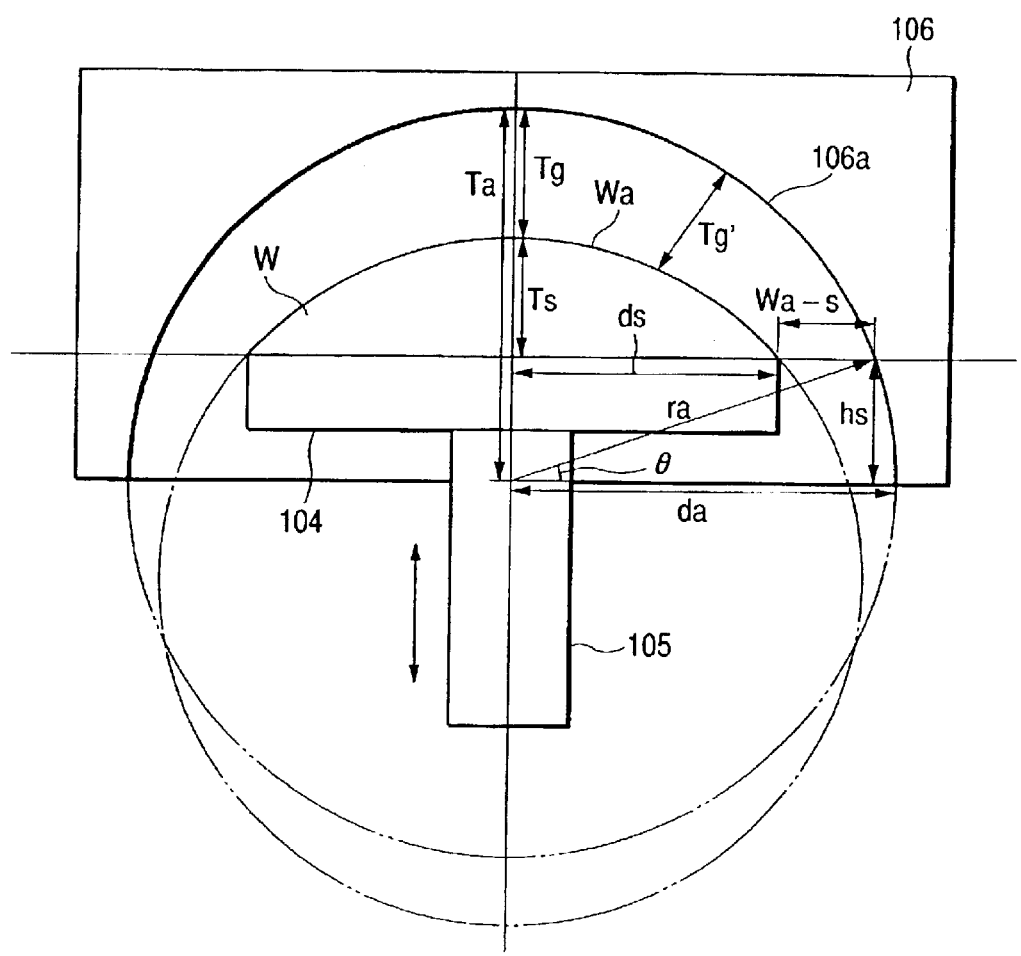
FIG. 6 is a schematic side view of the non-planar profile of the dielectric plate used in the embodiment of FIG. 1 when treating the surface of a convex lens whose largest thickness is more than 40 mm.

FIG. 6 is a schematic side view of the non-planar profile of the dielectric plate used in the embodiment of FIG. 1 when treating the surface of a convex lens whose largest thickness is more than 40 mm.

The spherical microwave emitting surface 106a of the dielectric plate 106 is so arranged that its radius of curvature ra is greater than the radius of curvature rs of the convex lens to be treated.

The holder 104 is lifted until the shortest distance Tg between the top of the surface Wa of the convex lens W and the microwave emitting surface 106a is found between 10 mm and 50 mm. It is so arranged that the distance Tg' between the surface of the convex lens and the microwave emitting surface along the edge of the convex lens is also found between 10 mm and 50 mm under this condition.

The dielectric plate having such a spherical surface is designed in a manner as will be discussed in greater detail hereinafter.

The relationship between the dielectric plate 106 having a spherical surface and the object of treatment W having also a spherical surface will be defined as follows when controlling the distance Tg between the spherical surface of the dielectric plate and that of the object of treatment to about less than 40 mm by modifying the radius of curvature ra and the aperture diameter da of the dielectric plate 106 as a function of the radius of curvature rs and the radius of aperture ds of the object of treatment W. Assume that the object of treatment has a thickness of Ts.

1) If Ts is not greater than 40 mm or 0<Ts≦40 mm (see FIG. 5) and the thickness, the radius of curvature and the radius of aperture of the object of treatment having a spherical surface are respectively Ts, rs and ds, whereas those of the dielectric plate also having a spherical surface are respectively Ta, ra and da, a dielectric plate whose Ta, ra and da are defined by the following expressions may well be used.

$$0 \text{ mm} \leq Tg \leq 50 \text{ mm and } 10 \text{ mm} \leq dg \leq 50 \text{ mm}$$

or $$10 \text{ mm} \leq ds \leq \sqrt{Ta(2ra-Ta)} - \sqrt{Ts(2rs-Ts)} \leq 50 \text{ mm}$$

2) If Ts is greater than 40 mm or Ts>40 mm (see FIG. 6) and Ta=ra=da (the dielectric plate is semispherical), provided that the height of the object on treatment holder is hs (>0), the height hs may well be so selected as to satisfy the following expressions, $$10 \text{ mm} \leq Ta-(Ts+hs) \leq 50 \text{ mm}$$

provided that the radial relationship between the object of treatment and the dielectric plate is Wa−s.

$$10 \text{ mm} \leq Wa-s \leq 50 \text{ mm}$$

therefore $$10 \text{ mm} \leq \sqrt{(ra^2-hs^2)} - ds \leq 50 \text{ mm}.$$

3) As for an object of treatment having a spherical surface and a particular profile, Ta, ra and da of the dielectric plate having a spherical surface may well be so selected as to make the distance Tg between the dielectric plate and the object of treatment also having a spherical surface satisfy the relationship of 10≦Tg≦50 regardless of the above requirements.

The above method of designing the dielectric plate having a spherical surface corresponding to the contour of the spherical surface of the object of treatment is described only as an example and it may be needless to say that the dielectric plate can be designed in various different ways.

Figure 7:
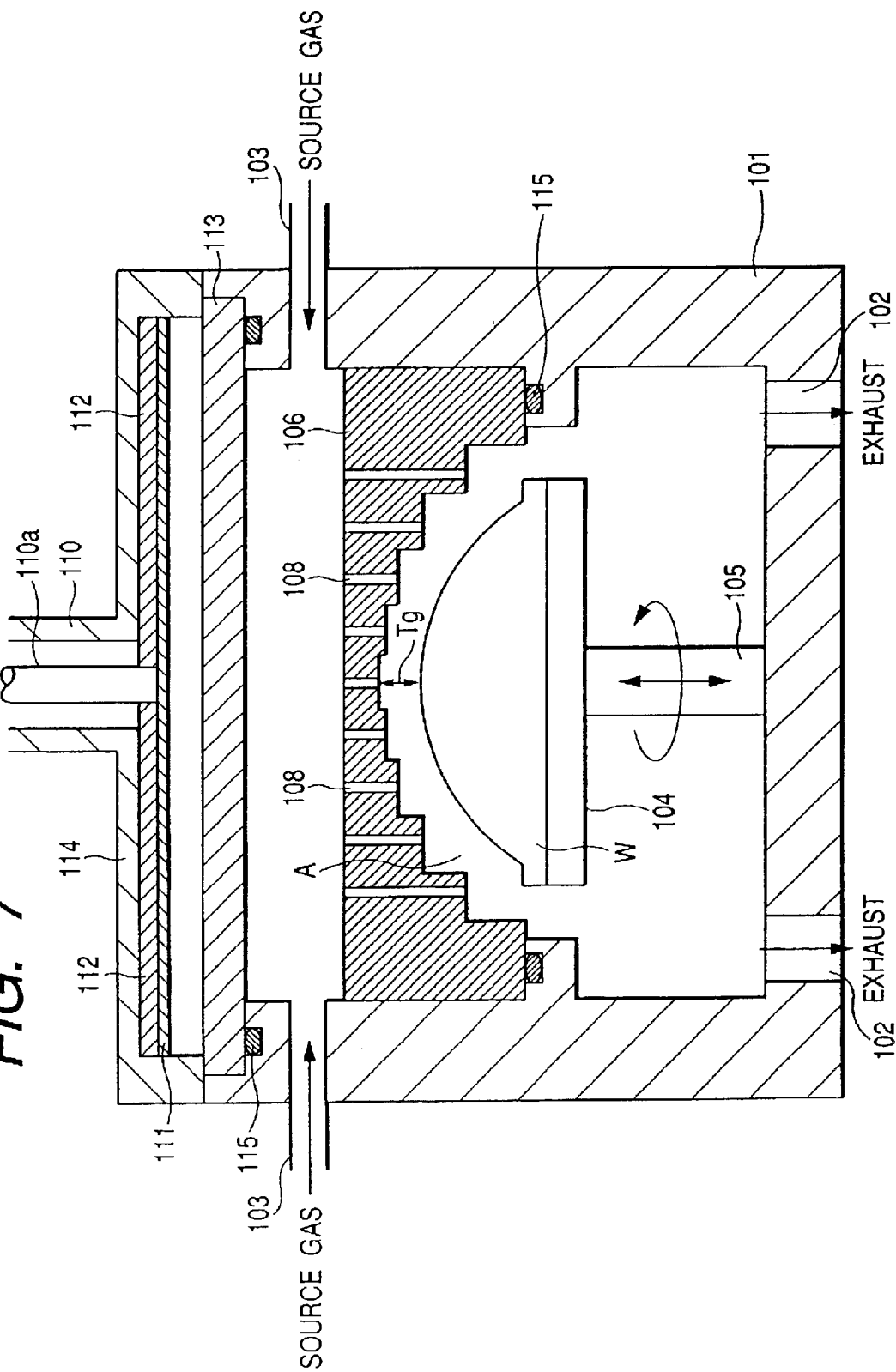
FIG. 7 is a schematic cross sectional view of an embodiment obtained by modifying the embodiment of FIG. 1 so as to make the microwave emitting surface of the dielectric plate show a stepped profile.

FIGS. 7, 8A and 8B are schematic views of an embodiment obtained by modifying the embodiment of FIG. 1 so as to make the microwave emitting surface of the dielectric plate 106 show a stepped profile. Note, however, that the stepped microwave emitting surface shows a contour approximated to that of the spherical surface of the dielectric plate. FIG. 7 is a cross sectional view of the embodiment and FIGS. 8A and 8B are respectively a schematic cross sectional view and a schematic plan view of the dielectric plate shown in FIG. 7.

FIG. 9 is a schematic cross sectional view of another embodiment of plasma treatment apparatus obtained by modifying the embodiment of FIG. 1 and suitably adapted to surface treatment of an object of treatment W, which is a concave lens. As shown, the dielectric plate 106 shows a contour similar to that of a concave lens and has a convex lower surface. The dielectric plate having such a convex microwave emitting surface may also be designed in a manner as described above by referring to a dielectric plate having a concave microwave emitting surface adapted to a convex lens. The lens is also arranged at a position that satisfies the relationship of 10≦Tg≦50.

Figure 10:
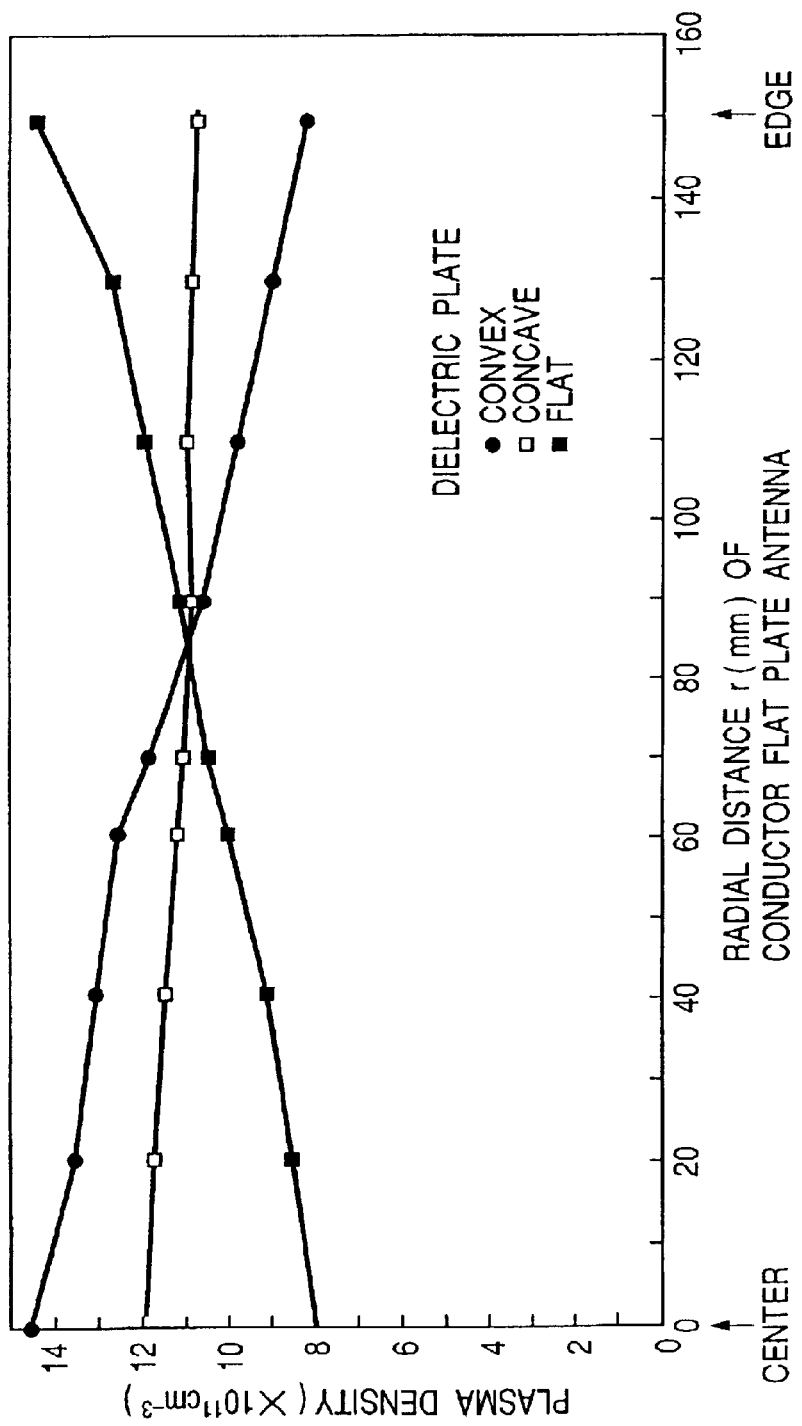
FIG. 10 is a graph showing the radial distance of the conductor flat plate antenna and the plasma density in different embodiments of the invention.

FIG. 10 is a graph showing the relationship between the radial distance of the conductor flat plate antenna and the plasma density in embodiments having respective dielectric plates 106 with a convex contour, a concave contour and a flat contour respectively for emitting a microwave, when a radial line slot antenna having the slots arranged radially substantially uniformly and coaxially on the circular conductor flat plate 111 of the antenna is used. It will be seen that the plasma density changes as a function of the distance from the radial center of the microwave antenna showing a suitable slot distribution pattern.

Since the absolute value of the horizontal axis depends on the location of the probe, FIG. 10 should be used to see the relative changes in the plasma density.

It will be seen that a conductor flat plate antenna having slots and showing a distribution pattern as indicated by white squares in FIG. 10 should be used because the plasma density produced by such an antenna for a microwave is radially substantially constant when the microwave is emitted from the antenna only by way of a flat dielectric member such as a dielectric thin plate member 113.

However, when the object of treatment shows a convex surface and hence the dielectric plate 106 shows a concave surface, the conductor flat plate antenna preferably shows a slot distribution pattern that produces a biased emission density of microwave that is low at the center and high along the outer periphery as indicated by black squares in FIG. 10. Conversely, when the dielectric plate 106 shows a convex surface, the conductor flat plate antenna preferably shows a slot distribution pattern that produces a biased emission density of microwave that is high at the center and low along the outer periphery as indicated by black circles in FIG. 10.

Figure 11:
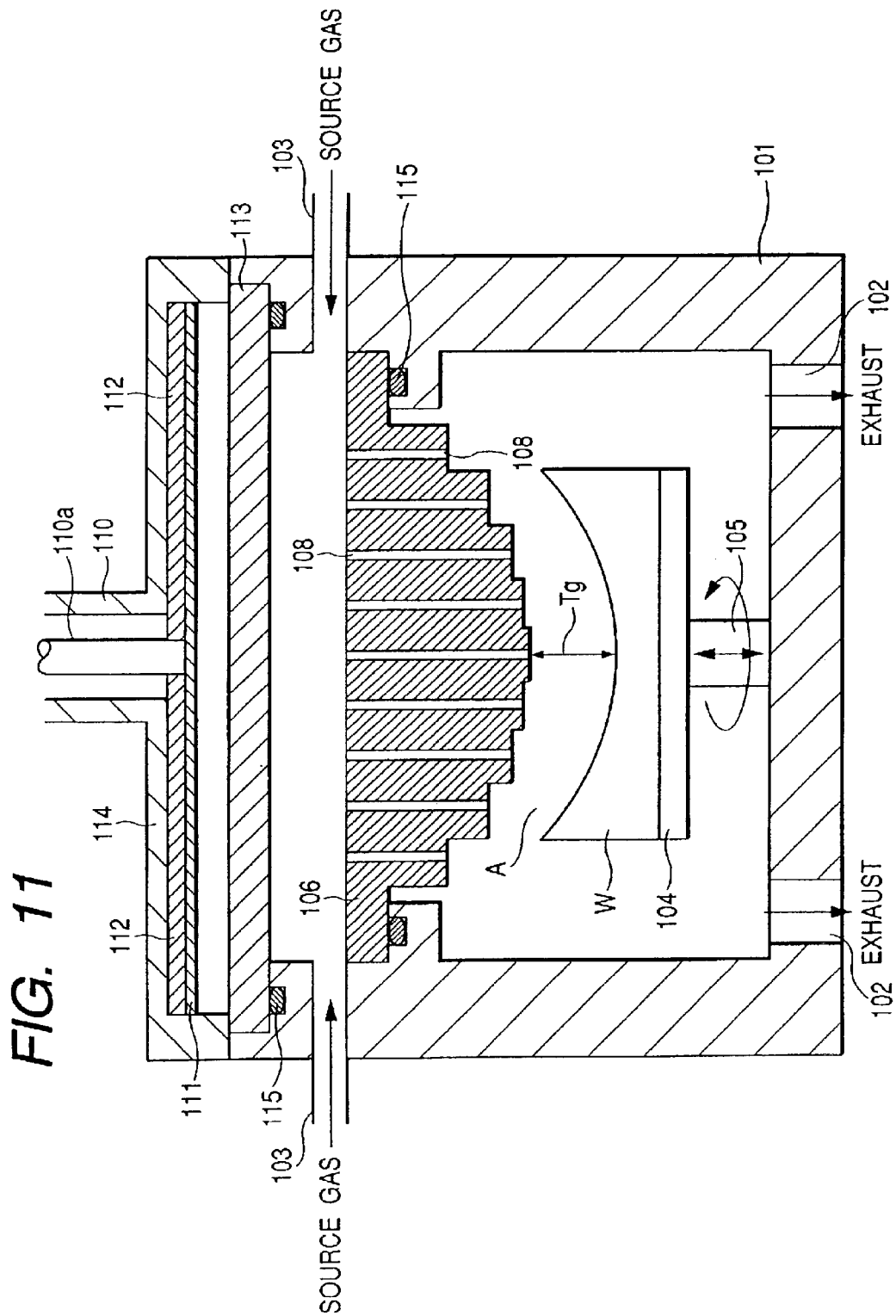
FIG. 11 is a schematic cross sectional view of still another embodiment of plasma treatment apparatus using a dielectric plate with a microwave emitting surface having a stepped and substantially convex profile.

FIG. 11 is a schematic cross sectional view of still another embodiment of plasma treatment apparatus using a non-planar dielectric plate 106 with a microwave emitting surface having a stepped and substantially convex profile.

FIGS. 12A and 12B are a schematic cross sectional view and a schematic plan view of the dielectric plate 106 of the apparatus of FIG. 11. FIG. 12A is a schematic cross sectional view and FIG. 12B is a schematic plan view of the dielectric plate 106. Again the microwave emitting surface of the dielectric plate is macroscopically non-planar.

Figure 13:
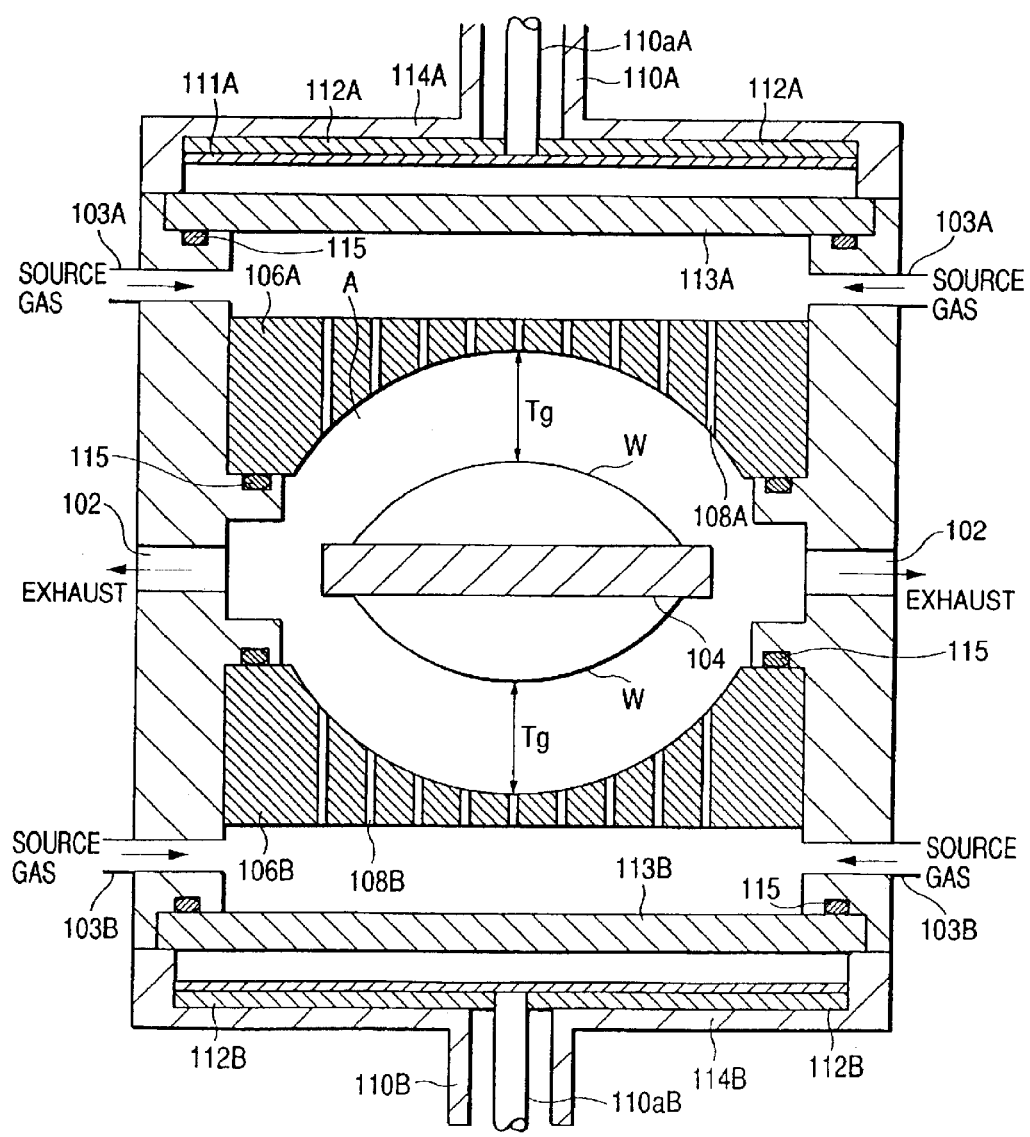
FIG. 13 is a schematic cross sectional view of still another embodiment of plasma treatment apparatus obtained by modifying the embodiment of FIG. 1 and suitably adapted to surface treatment of a convexo-convex lens.

FIG. 13 is a schematic cross sectional view of still another embodiment of plasma treatment apparatus obtained by modifying the embodiment of FIG. 1 and suitably adapted to surface treatment of a convexo-convex lens, as the dielectric plate 106 has microwave emitting surfaces that are vertically symmetric.

In FIG. 13, the components that are arranged vertically symmetrically are denoted by respective reference numerals that are affixed by A or B. Thus, there are shown non-planar dielectric plates 106A, 106B provided with respective gas supply paths 108A, 108B, coaxial tubes 110A, 110B, conductor flat plate antennas 111A, 111B and so on.

In this embodiment, the holder 104 is secured to the center of the apparatus, which is also the center of vertical symmetry to hold the object of treatment W along the periphery thereof. A bias potential can be applied to the holder 104. As in the case of the embodiment described above and adapted to surface treatment of a convex lens, a dense and fine film can be formed simultaneously on the opposite sides of the lens by means of this embodiment. Such a film shows an excellent intra-surface uniformity and is substantially free from defects. The design procedure of this embodiment is same as the one described above by referring to the surface treatment of a convex lens.

A pair of exhaust ports 102 are arranged laterally and symmetrically at the middle of the height of the apparatus. Otherwise, the embodiment has a configuration same as that of the preceding embodiments.

Figure 14:
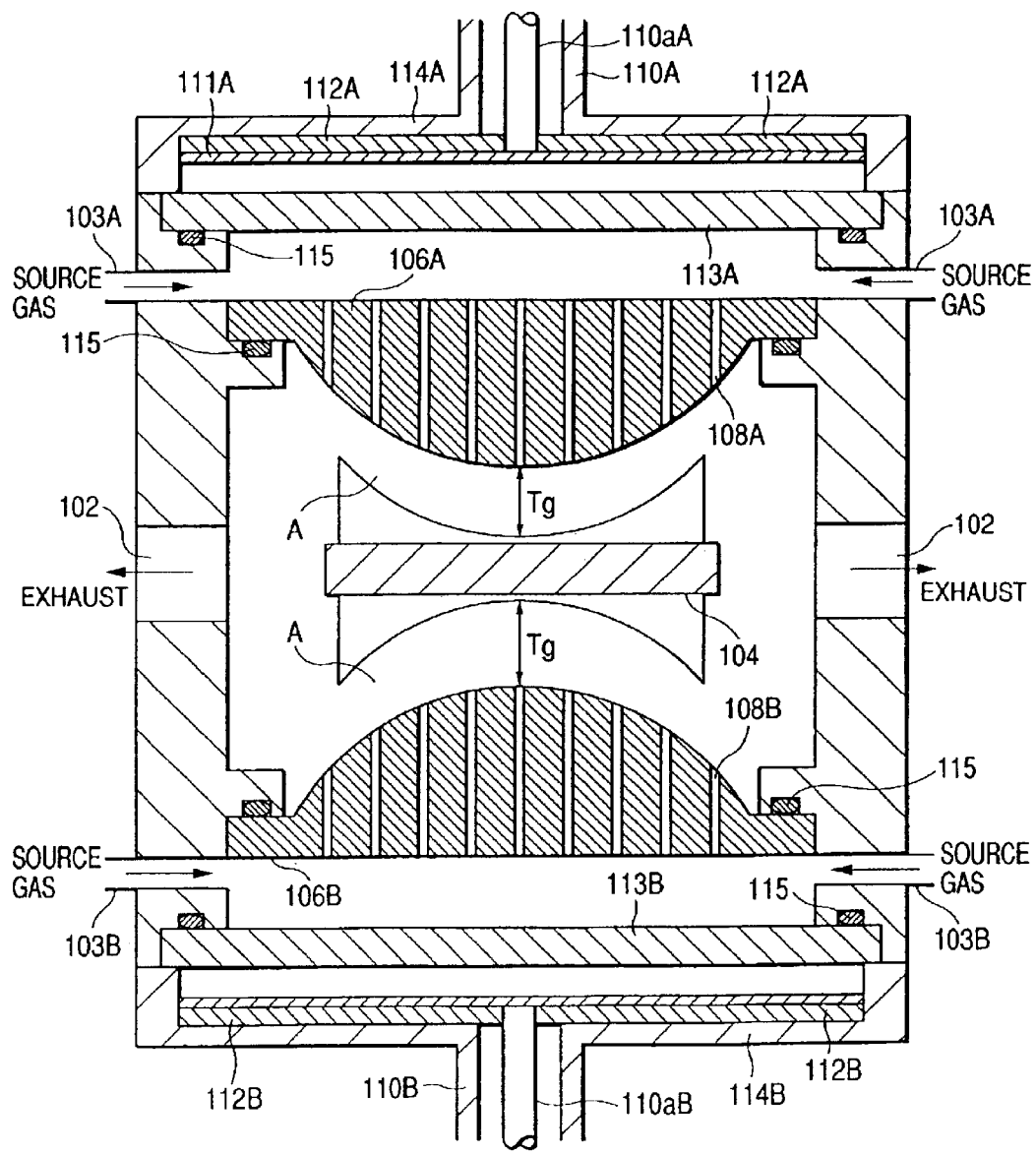
FIG. 14 is a schematic cross sectional view of still another embodiment of plasma treatment apparatus obtained by modifying the embodiment of FIG. 9 and suitably adapted to surface treatment of a concavo-concave lens.

FIG. 14 is a schematic cross sectional view of still another embodiment of plasma treatment apparatus obtained by modifying the embodiment of FIG. 9 and suitably adapted to surface treatment of a concavo-concave lens, as it has microwave emitting surfaces that are vertically symmetric.

Figure 15:
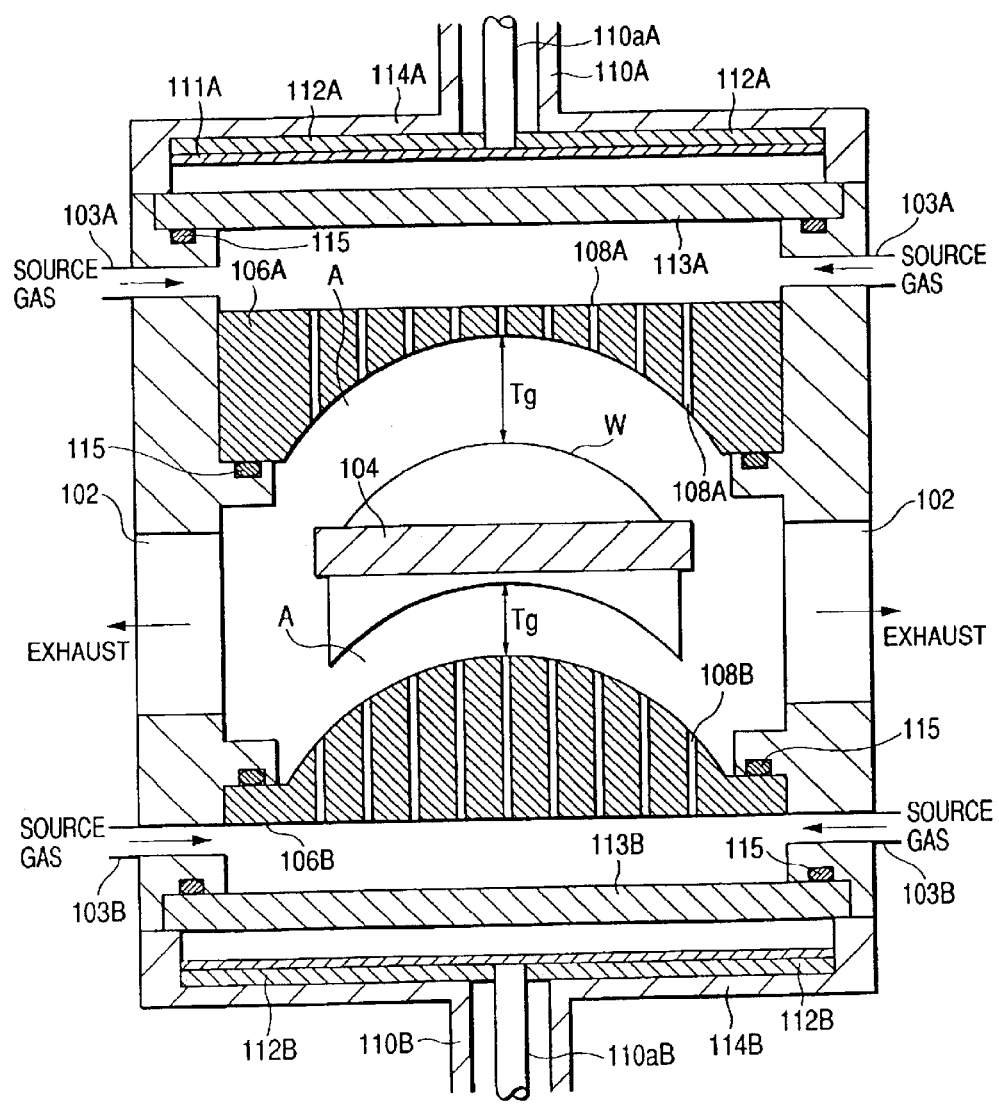
FIG. 15 is a schematic cross sectional view of still another embodiment of plasma treatment apparatus also obtained by modifying the embodiments of FIGS. 1 and 9 and suitably adapted to surface treatment of a convexo-concave lens.

FIG. 15 is a schematic cross sectional view of still another embodiment of plasma treatment apparatus obtained by modifying the embodiments of FIGS. 1 and 9 and suitably adapted to surface treatment of a convexo-concave lens. In FIGS. 14 and 15, the components same as those of FIG. 13 are denoted respectively by the same reference symbols. The effect of each of these embodiments is identical with that of the embodiment of FIG. 13 and they may be designed by following the above described design procedure.

Thus, as will be clear from the above description, the above embodiments of plasma treatment apparatus according to the invention can treat not only the surface of a spherical convex lens but also that of a spherical concave lens only by replacing the microwave supply means having an antenna with a concave profile with a microwave supply means having an antenna with a convex profile.

Figure 16:
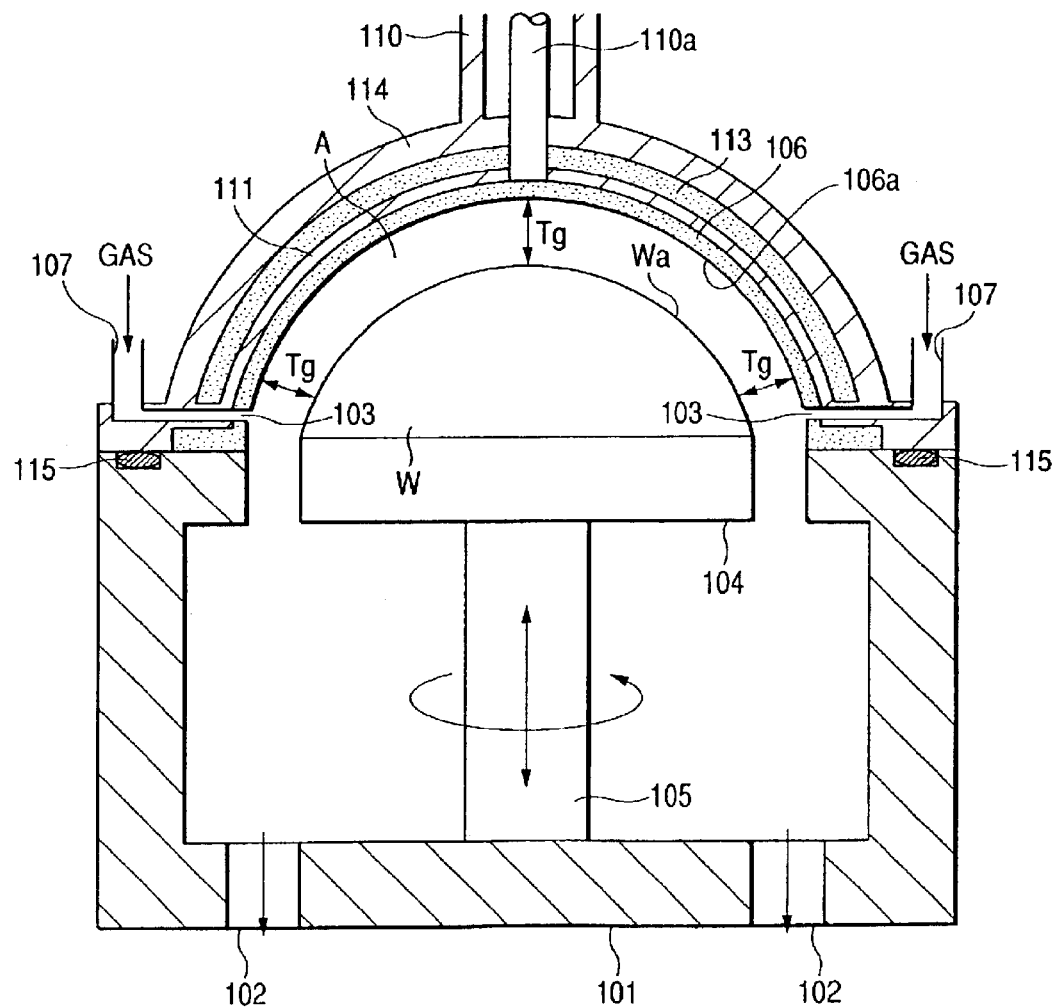
FIG. 16 is a schematic cross sectional view of another embodiment of plasma treatment apparatus according to the invention.

FIG. 16 is a schematic cross sectional view of another embodiment of plasma treatment apparatus according to the invention.

Referring to FIG. 16, 101 denotes a pressure reducible container, the internal pressure of which can be reduced to a level between about $1.33 \times 10^{-6}$ Pa and about 133 Pa by means of an evacuation means (not shown) connected to the exhaust port 102 of the container 101.

The container 101 is provided with a number of gas supply ports 103, through which gas can be fed into the container and turned into plasma by means of high frequency energy in the frequency band of UHF, SHF or EHF such as that of a microwave.

The container 101 contains therein a holder 104 for carrying and holding an object of treatment W. The holder 104 is vertically movable and revolvable so that it may take a selected height. A bias potential may be applied to the holder 104. A holder drive mechanism 105 is arranged to drive the holder to move vertically and/or revolve.

In FIG. 16, 106 denotes a non-planar dielectric plate provided with a number of gas supply ports 108 and made of a dielectric substance.

The dielectric plate 106 is made of a dielectric substance that can transmit microwaves. Materials that can be used for the dielectric plate include aluminum oxide, silicon oxide, aluminum nitride, calcium fluoride and magnesium fluoride.

The gas fed into the container 101 from a gas inlet port 107 connected to a gas supply system (not shown) is directed into plasma processing space A by way of gas supply port 103 arranged in the dielectric plate 106.

The dielectric plate 106 has a concave and spherical lower surface because it is adapted to treat the surface of a convex lens having a spherical profile.

In FIG. 16, 115 denotes an O-ring for securing a vacuum condition inside the treatment space.

A microwave is introduced in a manner as described below.

The microwave supply means comprises a coaxial tube 110, a conductor antenna 111 having a spherical surface and a number of slots and a dielectric thin film 113 operating as microwave supply window. The inner conductor 110a of the coaxial tube 110 is connected to the center of the conductor antenna 111. Reference numeral 114 in FIG. 16 denotes an antenna adapter.

The microwave generated by a microwave oscillator (not shown) is transmitted to the conductor antenna 111 by way of the coaxial tube 110. The microwave that has been transmitted is then emitted through the slots arranged in the antenna 111.

A microwave supply means as used for this b embodiment is obtained by bending a radial line slot antenna (RLSA) and described in detail in Japanese Patent Application Laid-Open No. 1-184923 and U.S. Pat. No. 5,034,086 as well as in Japanese Patent Applications Laid-Open Nos. 8-111297 and 4-48805 to show a spherical surface.

Figure 17:
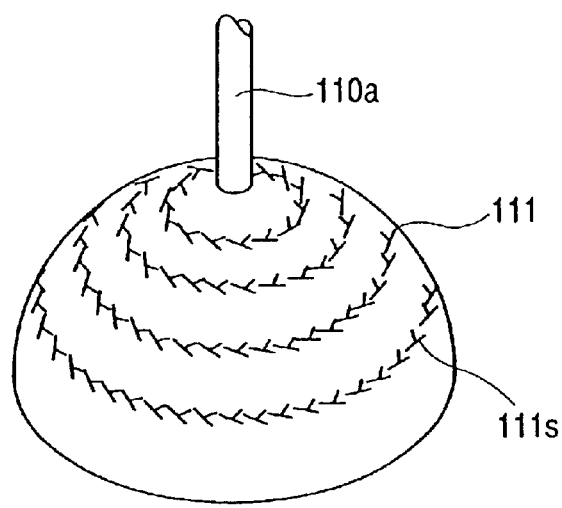
FIG. 17 is a schematic perspective view of a radial line slot antenna having a spherical profile.

FIG. 17 is a schematic perspective view of an RLSA having a spherical surface and realized by coaxially or helically arranging a number of slots 111S in a spherical (semispherical to be more accurate) conductor 111. The inner conductor 110a of the coaxial tube 110 is connected to the center of the conductor antenna 111.

Each of the slots 111S comprises a pair of notches directed to intersect each other, the lengths and the intervals of the notches being appropriately selected as a function of wavelength of the microwave and the plasma intensity required for the surface treatment.

Figure 18A:
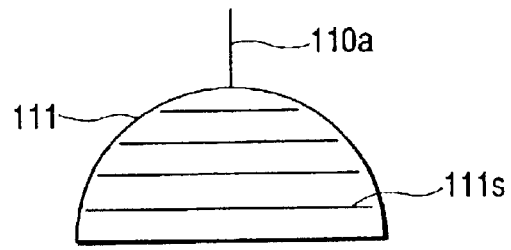
FIGS. 18A, 18B and 18C are schematic side views of different conductor antennas having a spherical profile.
Figure 18B:
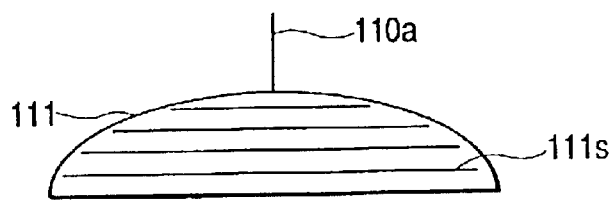
Figure 18C:
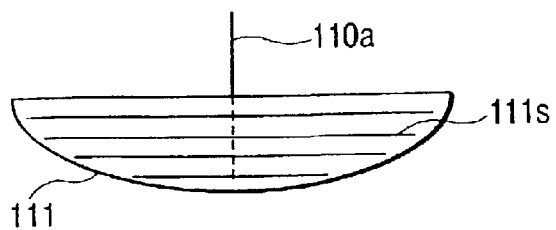

FIGS. 18A through 18C are schematic side views of different conductor antennas having a spherical profile that can be used for the purpose of the invention.

FIG. 18A shows an antenna showing a proper semispherical profile obtained by dividing a ball into two equal halves.

FIG. 18B shows an antenna showing a spherical profile that is part of a ball.

FIG. 18C shows an antenna having a spherical and convex profile and adapted to cover a concave lens.

While the profile of each of the slots is not shown in the antennas of FIGS. 18A through 18C, slots as shown in FIG. 17 may preferably be used for them.

Now, an operation of forming a thin film on a lens having a spherical surface by means of the above embodiment of plasma treatment apparatus according to the invention will be described below.

Firstly, a convex lens is placed on the holder 104 in the apparatus and securely held in position with the surface to be treated of the lens facing upward.

Then, the holder 104 is raised by means of the drive mechanism 105 until the surface 106a of the microwave supply means facing the object of treatment and the opposite surface Wa to be treated of the object are separated by a distance of 10 mm and 50 mm.

Then, after reducing the internal pressure of the container 101 to about $1.3 \times 10^{-5}$ Pa by means of the evacuation pump connected to the exhaust port 102, processing gas is fed into the plasma processing space A by way of the gas blow-in ports 103 as gas is supplied from the supply system connected to the gas supply ports 107. The internal pressure of the container is held to an appropriately selected level between 13.3 Pa and $1.33 \times 10^3$ Pa by controlling both the gas supply rate and the gas exhaust rate. Then, a microwave is supplied to the conductor antenna 111 having a spherical surface by way of the coaxial tube 110 as the microwave is supplied from the microwave oscillator connected to the coaxial tube 110.

Thus, a glow discharge occurs to produce gas plasma in the plasma processing space A. The produced plasma will show a high density of between $10^{11}$ and $10^{13}$ cm$^{-3}$ so that a dense and high quality film will be formed on the lens.

With this embodiment, since the width, or the gap Tg, of the plasma processing space is less than 10 mm (more specifically less than 50 mm and much less than 10 mm), any reaction by-products produced in the space A can be quickly removed with exhaust gas so that the formed film will be practically free from pin holes and hence of high quality.

The relationship between the gap Tg separating the dielectric plate 106 and the object of treatment W and the plasma density in the embodiment of FIG. 16 also conforms to the graph of FIG. 4. It will be seen that, when Tg is smaller than 10 mm, the plasma density changes significantly depending on Tg, and when Tg exceeds 50 mm, the plasma density falls abruptly. However, the relative density difference of the plasma is found below 20% so that consequently a uniform film will be formed when the gap is found within the range of 10 mm<Tg≦50 mm sandwiched between a pair of inflection points in FIG. 4.

Thus, the above embodiment of plasma treatment apparatus according to the invention can treat not only the surface of a spherical convex lens but also that of a spherical concave lens only by replacing the microwave supply means having an antenna with a concave profile with a microwave supply means having an antenna with a convex profile.

Figure 19:
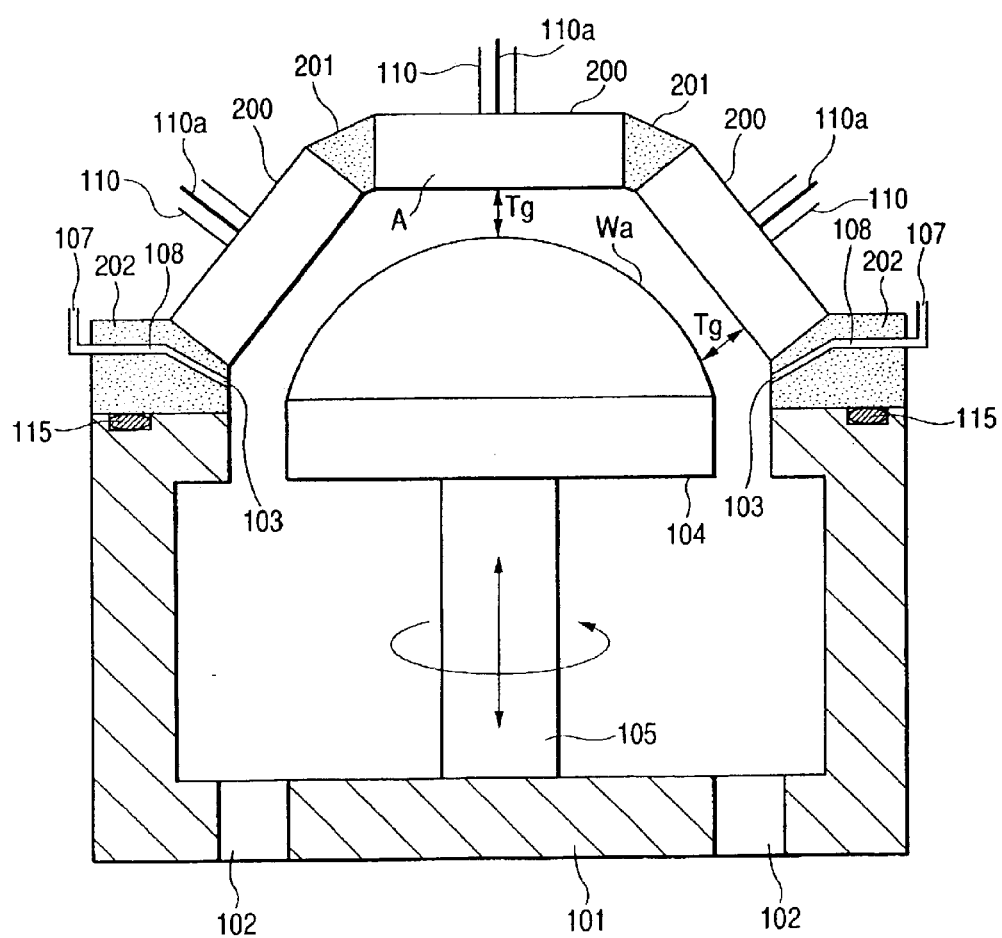
FIG. 19 is a schematic cross sectional view of still another embodiment of plasma treatment apparatus according to the invention.

FIG. 19 is a schematic cross sectional view of still another embodiment of plasma treatment apparatus according to the invention.

Referring to FIG. 19, 101 denotes a pressure reducible container, the internal pressure of which can be reduced to a level between about $1.33 \times 10^{-6}$ Pa and about 133 Pa by means of an evacuation means (not shown) connected to the exhaust port 102 of the container 101.

The container 101 is provided with a number of gas blow-in ports 103, through which gas can be fed into the container and turned into plasma by means of high frequency energy in the frequency band of UHF, SHF or EHF such as that of a microwave.

The container 101 contains therein a holder 104 for carrying and holding an object of treatment W. The holder 104 is vertically movable and revolvable so that it may take a selected height. A bias potential may be applied to the holder 104. A holder drive mechanism 105 is arranged to drive the holder to move vertically and/or revolve.

In FIG. 19, 200 denote microwave emitting members and 201 denote sealing members made of ceramic for sealing the gaps separating the microwave emitting members of the embodiment. Reference numeral 115 denotes an O-ring.

The gas fed into the container 101 through a gas supply ports 107 connected to a gas supply system (not shown) is directed into plasma processing space A by way of gas blow-in ports 103 after passing through the gas supply paths 108 arranged in a dielectric member 202.

This embodiment is adapted to treat the surface of a convex lens having a spherical profile.

Figure 20:
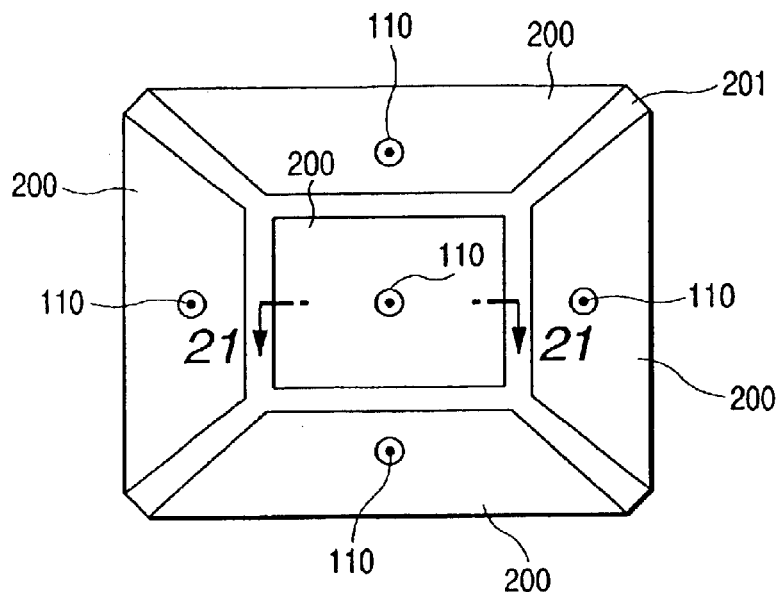
FIG. 20 is a schematic plan view of the microwave supply means of the embodiment of FIG. 19.

FIG. 20 is a schematic plan view of the microwave supply means of the embodiment of FIG. 19.

The microwave supply means of this embodiment is an integrated entity of five rectangular microwave emitting members 200 arranged in a manner as shown in FIG. 20.

Figure 21:
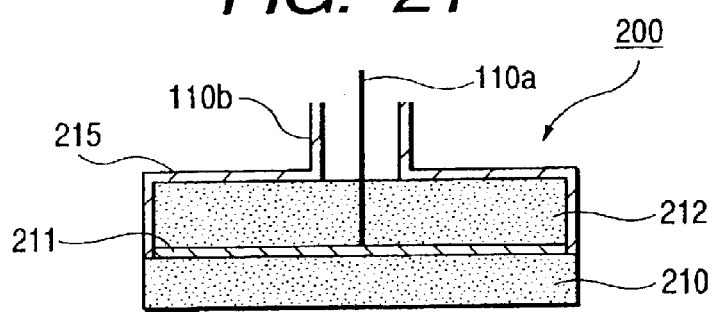
FIG. 21 is a schematic cross sectional view of one of the microwave emitting members of FIG. 20 taken along line 21—21.

FIG. 21 is a schematic cross sectional view of the microwave supply means of FIG. 20 taken along line 21—21, showing only the central microwave emitting member 200 in cross section. All the remaining microwave emitting members 200, though having a different profile, have a structure same as that of the member of FIG. 21.

Referring to FIG. 21, 211 denotes a conductor flat plate antenna having a number of slots. The inner conductor 110a of a coaxial waveguide 110 is connected to the conductor flat plate antenna 211 at a point near the center of the latter, while the conductor flat plate antenna 211 is covered at an outer peripheral end thereof by a conductor cover 215 connected to the outer conductor 110b of the coaxial waveguide 110.

A dielectric plate 210 that transmits microwaves is arranged on the microwave emitting surface of the conductor flat plate antenna 211. If necessary, another dielectric member 212 may be arranged on the opposite surface of the conductor flat plate antenna 211. The dielectric member 212 may be held in contact with the antenna 211 or separated from the latter by a space. The dielectric plate 210 is typically made of a material selected from alumina, quartz, aluminum nitride, calcium fluoride and magnesium fluoride.

Figure 22:
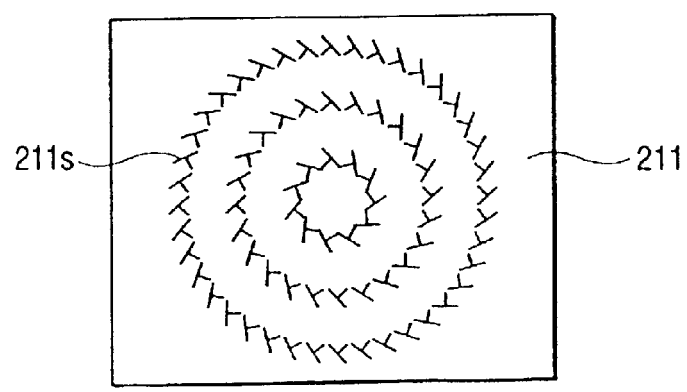
FIG. 22 is a schematic plan view of one of the conductor flat plate antennas of the embodiment of FIG. 19.

FIG. 22 is a schematic plan view of the conductor flat plate antenna 211 having a number of coaxially or vortically arranged slots 211S.

Such an antenna is referred to as radial line slot antenna and described in detail in Japanese Patent Application Laid-Open No. 1-184923 and U.S. Pat. No. 5,034,086 as well as in Japanese Patent Applications Laid-Open Nos. 8-111297, 4-48805 and 5-22025.

All the distances Tg between the microwave emitting surfaces of the microwave emitting members 200 and the object of treatment W are made to show a substantially constant value, which is found within a permissible range, e.g., between 10 mm and 50 mm.

A microwave is introduced in a manner as described below.

The microwave generated by a single microwave generator (not shown) is divided into five, which are then transmitted to the respective conductor flat plate antennas 211 by way of the respective coaxial tubes 110.

The microwave transmitted to each of the antenna 211 by way of the slots of the antenna will then emitted.

Now, an operation of forming a thin film on a lens having a spherical surface by means of the above embodiment of plasma treatment apparatus according to the invention will be described below.

Firstly, a convex lens is placed on the holder 104 in the apparatus and securely held in position with the surface to be treated of the lens facing upward.

Then, the holder 104 is raised by means of the drive mechanism until the gap Tg separating the surface of the microwave supply means facing the object of treatment and the opposite surface to be treated of the object is found between 10 mm and 50 mm.

Then, after reducing the internal pressure of the container 101 to about $1.3 \times 10^{-5}$ Pa by means of the evacuation pump connected to the exhaust port 102, processing gas is fed into the plasma processing space A by way of the gas supply paths 108 and the gas blow-in ports 103 as gas is supplied from the supply system connected to the gas supply ports 107. The internal pressure of the container is held to an appropriately selected level between 13.3 Pa and $1.33 \times 10^3$ Pa by controlling both the gas supply rate and the gas exhaust rate. Then, a microwave is supplied to the conductor flat plate antennas 211 by way of the coaxial tube 110 as the microwave is supplied from the microwave oscillator connected to the coaxial tube 110.

Thus, a glow discharge occurs to produce gas plasma in the plasma processing space A. The produced plasma will show a high density of between $10^{11}$ and $10^{13}$ cm$^{-3}$ so that a dense and high quality film will be formed on the lens.

With this embodiment, since the width, or the gap Tg, of the plasma processing space is less than 10 mm (more specifically less than 50 mm and much less than 10 mm), any reaction by-products produced in the space A can be quickly removed with exhaust gas so that the formed film will be practically free from pin holes and hence of high quality.

The relationship between the gap Tg separating the dielectric plate 106 and the object of treatment W and the plasma density in the embodiment of FIG. 16 also conforms to the graph of FIG. 4. It will be seen that, when Tg is smaller than 10 mm, the plasma density changes significantly depending on Tg, and when Tg exceeds 50 mm, the plasma density falls abruptly. However, the relative density difference of the plasma is found below 20% so that consequently a uniform film will be formed when the gap is found within the range of 10 mm<Tg≦50 mm sandwiched between a pair of inflection points in FIG. 4.

Figure 23:
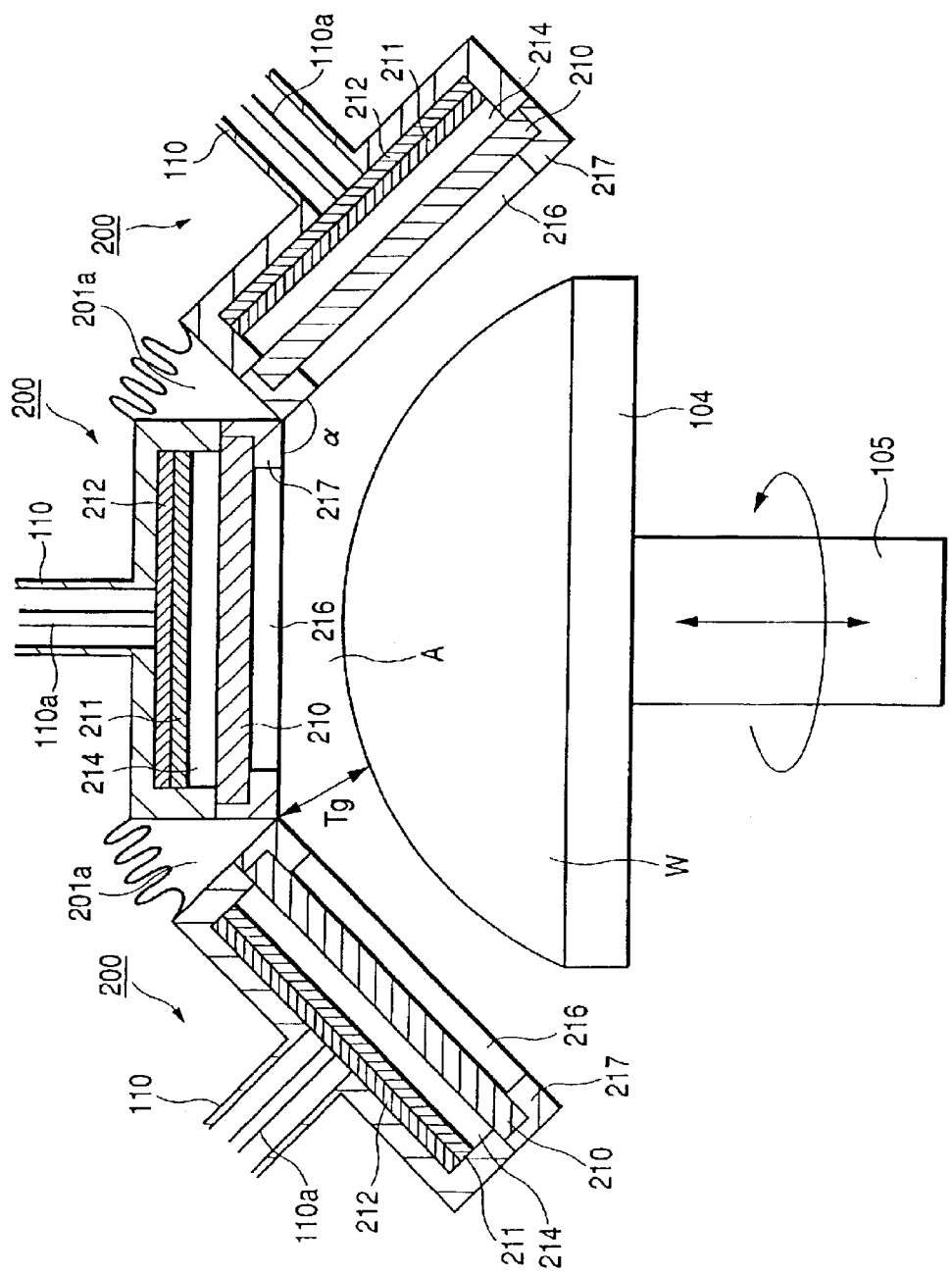
FIG. 23 is a schematic cross sectional view of still another embodiment of plasma treatment apparatus according to the invention.
Figure 24:
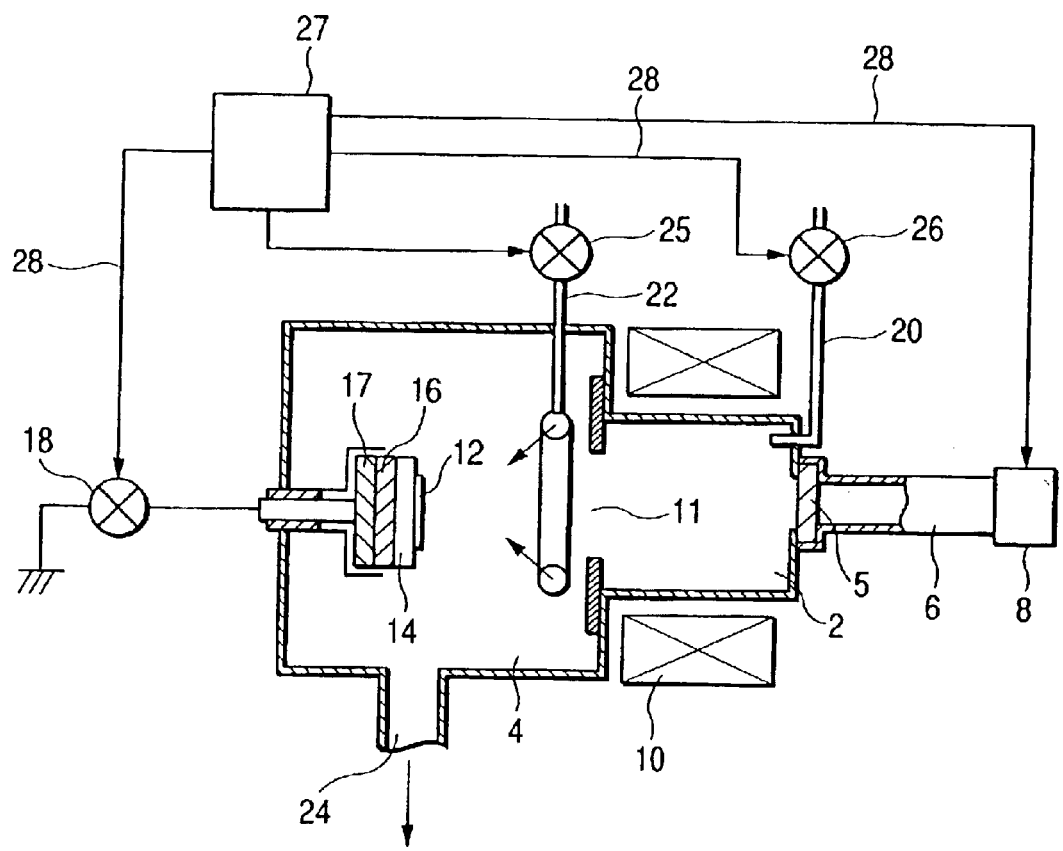
FIG. 24 is a schematic cross sectional view of a known plasma treatment apparatus.

FIG. 23 is a schematic cross sectional view of still another embodiment of plasma treatment apparatus according to the invention, showing the positional relationship between the microwave emitting members 200 and the object of treatment W.

Referring to FIG. 23, a regulator means 201a is arranged between any two adjacently located microwave emitting members 200 to regulate the angle a between the microwave emitting members 200. The regulator means 201a has an expandable bellows or diaphragm and an O-ring is arranged along the boundary of each of the emitting members 200 to produce an airtight sealing effect. An antenna cooling space 214 is formed between the conductor flat plate antenna 211 and the corresponding dielectric member 210 of each of the microwave emitting members 200. Reference numerals 216 and 217 denote members made of a dielectric substance and adapted to rigidly hold the dielectric members 210.

The gap Tg is made to be found within a range between 10 mm and 50 mm by regulating the angle α and vertically moving the holder 104.

Thus, convex lenses having different radii of curvature can be processed for surface treatment by means of the above described embodiment.

Additionally, the above described embodiment of plasma treatment apparatus according to the invention can treat not only the surface of a spherical convex lens but also that of a spherical concave lens only by replacing the microwave supply means having an antenna with a concave profile with a microwave supply means having an antenna with a convex profile as shown in FIGS. 9 through 12A and 12B.

While the upper surface of the dielectric plate 106 is planar and the lower surface is curved in the embodiment of FIG. 1, the upper surface of the dielectric plate 106 may be curved to make the dielectric plate 106 show a uniform thickness between the upper and lower surfaces.

Similarly, the upper surface of the dielectric plate 106 in FIG. 7 may have a stepped profile.

Likewise, the upper surface of the dielectric plate 106 in FIG. 9 may be made to show a concave profile.

In short, the profile of the dielectric plate is not limited to those illustrated in the drawings, which merely exemplify preferred embodiments.

Objects of treatment W that can be treated by means of an apparatus according to the invention include those that are made of a material selected from insulating and transparent materials such as synthetic fused silica ($SiO_2$) and fluorite ($CaF_2$) and those made of a material selected from electrically conductive and non-light-transmitting materials such as aluminum. The former materials are typically used for convex lenses, concave lenses, reflectors and window members, whereas the latter materials are typically used for reflectors.

Rays of light that can be converged, transmitted and/or reflected by an optical part according to the invention include ultraviolet rays such as ArF excimer laser, KrF excimer laser or i-rays, rays of visible light and infrared rays.

Surface treatment operations that can be conducted by means of an apparatus according to the invention include thin film formation, plasma cleaning and plasma etching. An apparatus according to the invention is advantageously adapted to form thin film of a material such as aluminum oxide, silicon oxide, tantalum oxide, magnesium oxide, aluminum fluoride and magnesium fluoride.

Since thin film is formed by plasma CVD, source gases that can be used for the purpose of the invention include organic aluminum compounds such as trimethylaluminum (TMA), triisobutylaluminum (TiBA) and dimethylaluminumhalide (DMAH), silicon compounds such as $SiH_4$, $Si_2H_6$, $SiF_4$ and tetraethylorthosilicate (TEOS), organic magnesium compounds such as bisethylcyclopentadienylmagnesium and tantalum compounds. Preferably, an oxidizing gas such as oxygen, nitrogen oxide, fluorine and $NF_3$ is added to the source gas. If necessary, hydrogen, helium, neon, argon, xenon or krypton gas may also be added to the source gas.

For the purpose of the invention, the microwave generator may be an ordinary microwave generator adapted to generate a microwave with a frequency of 2.45 GHz, 5.0 GHz or 8.3 GHz.

EXAMPLE 1

A convex lens of synthetic fused silica having a polished spherical surface was placed on and rigidly secured to the holder 104 of the apparatus of FIG. 1.

Then, the holder 104 was lifted by operating the drive mechanism 105 and then rigidly held to a position where the gap Tg was found to be between 20 and 30 mm. After reducing the internal pressure of the aluminum container 1 to $1.3 \times 10^4$ Pa, the holder 104 was made to revolve. Gasified TMA and $O_2$ were then introduced into the container, when the internal pressure was reduced further to 13.3 Pa and a microwave was supplied to generate plasma. As a result, an aluminum oxide film was formed on the spherical convex surface of the quartz.

EXAMPLE 2

A convex of synthetic fused silica lens having a polished spherical surface was placed on and rigidly secured to the holder 104 of the apparatus of FIG. 16.

Then, the holder 104 was lifted by operating the drive mechanism 105 and then rigidly held to a position where the gap Tg was found to be between 20 and 30 mm. After reducing the internal pressure of the aluminum container 1 to $1.3 \times 10^4$ Pa, the holder 104 was made to revolve. Gasified TMA and $O_2$ were then introduced into the container, when the internal pressure was reduced further to 13.3 Pa and a microwave was supplied to generate plasma. As a result, an aluminum oxide film was formed on the spherical convex surface of the quartz.

EXAMPLE 3

A convex lens of synthetic fused silica having a polished spherical surface was placed on and rigidly secured to the holder 104 of the apparatus of FIG. 19.

Then, the holder 104 was lifted by operating the drive mechanism 105 and then-rigidly held to a position where the gap Tg was found to be between 20 and 30 mm. After reducing the internal pressure of the aluminum container 1 to $1.3 \times 10^4$ Pa, the holder 104 was made to revolve. Gasified TMA and $O_2$ were then introduced into the container, when the internal pressure was reduced further to 13.3 Pa and a microwave was supplied to generate plasma. As a result, an aluminum oxide film was formed on the spherical convex surface of the quartz.

When $F_2$ gas was used in place of $O_2$ gas, a high quality aluminum fluoride film was formed on the surface of the quartz lens.

As described above in detail, according to the invention, the surface of an optical part having a concave or convex surface to be treated can be treated uniformly by means of high density microwave plasma.

What is claimed is:

1. A method of manufacturing an optical part comprising the steps of:

providing on a holder an optical part having a convex or concave surface;

selecting a height of the holder carrying the optical part to provide a desired distance between the optical part and a microwave supply means;

making the holder revolve; and treating the surface of the optical part using a plasma treatment apparatus in which a surface of the microwave supply means is located opposite to the convex or concave surface of the optical part and has a non-planar contour corresponding to the convex or concave surface of the optical part so as to approximately follow the surface of the optical part.

2. The method according to claim 1, wherein the surface of the microwave supply means is formed of a microwave-transmitting dielectric.

3. The method according to claim 1, wherein the microwave supply means has an assembly of a plurality of microwave-emitting plate members.

4. The method according to claim 1, wherein the microwave supply means has a plurality of openings for supplying gas for plasma excitation.

5. The method according to claim 1, wherein a film coat is formed on the optical part.

6. The method according to claim 1, wherein an antireflection or reflection-boosting thin film is formed on the optical part made of silicon oxide or calcium fluoride.

7. A method of uniformly treating a surface of an optical part comprising the steps of:

providing on a holder an optical part having a convex or concave surface where a radius of the optical part is at least 10 mm;

selecting a height of the holder carrying the optical part to so that a distance between the optical part and a surface of a microwave supply means, which faces the optical part and has a non-planar contour corresponding to the convex or concave surface of the optical part, is from 10 mm to 50 mm over an entire area where the optical part and so as to approximately follow the surface of the optical part the microwave supply means face each other; and treating the surface of the optical part with plasma.

8. The method according to claim 7, wherein the surface of the microwave supply means is formed of a microwave-transmitting dielectric.

9. The method according to claim 7, wherein the microwave supply means has an assembly of a plurality of microwave-emitting plate members.

10. The method according to claim 7, wherein the microwave supply means has a plurality of openings for supplying gas for plasma excitation.

11. The method according to claim 7, wherein a thin film is formed on the surface of the optical part.

12. The method according to claim 7, wherein an antireflection or reflection-boosting thin film is formed on the optical part made of silicon oxide or calcium fluoride.

* * * * *

UNITED STATES PATENT AND TRADEMARK OFFICE
CERTIFICATE OF CORRECTION

PATENT NO. : 6,929,830 B2
DATED : August 16, 2005
INVENTOR(S) : Goushu Tei et al.

It is certified that error appears in the above-identified patent and that said Letters Patent is hereby corrected as shown below:

Column 6,
Line 47, "and" should read -- to --.

Column 11,
Line 6, "b" should be deleted.

Column 13,
Line 30, "emitted." should read -- be emitted. --.

Column 14,
Line 17, "angle a" should read -- angle α --.

Column 15,
Lines 29, 43 and 58, "container 1" should read -- container 101 --;
Line 37, "convex" should read -- convex lens --; "lens" should be deleted; and
Line 56, "then-rigidly" should read -- then rigidly --.

Column 16,
Line 42, "to" should be deleted;
Line 46, "part, is" should read -- part so as to approximately follow the surface of the optical part, is --;
Line 48, "so as to approximately follow the surface of" should be deleted; and
Line 49, "the optical part" should be deleted.

Signed and Sealed this

Thirty-first Day of January, 2006

JON W. DUDAS
*Director of the United States Patent and Trademark Office*